(12) United States Patent
Tobita et al.

(10) Patent No.: US 7,443,944 B2
(45) Date of Patent: Oct. 28, 2008

(54) SHIFT REGISTER, IMAGE DISPLAY APPARATUS CONTAINING THE SAME AND SIGNAL GENERATION CIRCUIT

(75) Inventors: Youichi Tobita, Tokyo (JP); Hiroyuki Murai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/838,416

(22) Filed: Aug. 14, 2007

(65) Prior Publication Data

US 2008/0116944 A1 May 22, 2008

(30) Foreign Application Priority Data

Nov. 20, 2006 (JP) ............................. 2006-312865

(51) Int. Cl.
*G11C 19/00* (2006.01)
(52) U.S. Cl. .......................................... 377/64; 377/67
(58) Field of Classification Search ................ None
See application file for complete search history.

(56) References Cited

U.S. PATENT DOCUMENTS

| 3,506,851 | A | | 4/1970 | Polkinghorn et al. |
| 3,710,271 | A | | 1/1973 | Putnam |
| 3,714,466 | A | | 1/1973 | Spence |
| 3,898,479 | A | | 8/1975 | Proebsting |
| 5,517,543 | A | * | 5/1996 | Schleupen et al. ............ 377/79 |
| 6,064,713 | A | * | 5/2000 | Lebrun et al. ................. 377/67 |
| 6,580,411 | B1 | * | 6/2003 | Kubota et al. ................. 345/98 |
| 7,120,221 | B2 | * | 10/2006 | Moon ........................... 377/64 |
| 7,289,593 | B2 | * | 10/2007 | Tobita et al. .................. 377/64 |
| 7,289,594 | B2 | * | 10/2007 | Moon ........................... 377/68 |
| 7,317,780 | B2 | * | 1/2008 | Lin et al. ....................... 377/67 |
| 7,342,568 | B2 | * | 3/2008 | Wei et al. ..................... 345/100 |
| 2005/0008114 | A1 | * | 1/2005 | Moon ........................... 377/64 |
| 2007/0164973 | A1 | | 7/2007 | Tobita |
| 2007/0195053 | A1 | | 8/2007 | Tobita et al. |
| 2007/0195920 | A1 | | 8/2007 | Tobita |
| 2007/0217564 | A1 | | 9/2007 | Tobita |

FOREIGN PATENT DOCUMENTS

JP 2004-246358 9/2004

OTHER PUBLICATIONS

U.S. Appl. No. 11/838,416, filed Aug. 14, 2007, Tobita et al.
U.S. Appl. No. 11/937,791, filed Nov. 9, 2007, Tobita.
Soo Young Yoon, et al., "P-172L: Late-News Poster: Highly Stablel Integrated Gate Driver Circuit using a-Si TFT with Dual Pull-down Structure," SID 05 Digest, pp. 348-351.
U.S. Appl. No. 11/831,131, filed Jul. 31, 2007, Tobita.

* cited by examiner

*Primary Examiner*—Cassandra Cox
(74) *Attorney, Agent, or Firm*—Oblon, Spivak, McClelland, Maier & Neustadt, P.C.

(57) ABSTRACT

A unit shift register includes a first transistor for supplying an output terminal with a clock signal, and second and third transistors for discharging the output terminal, and further includes a fourth transistor having its gate connected to the gate node of the second transistor and discharging the gate node of the first transistor, and a fifth transistor having its gate connected to the gate node of the third transistor and discharging the gate node of the first transistor. Input of the clock signal is prohibited just after the change in level of first and second control signals for switching between the second and third transistors.

24 Claims, 23 Drawing Sheets

F I G . 3 A
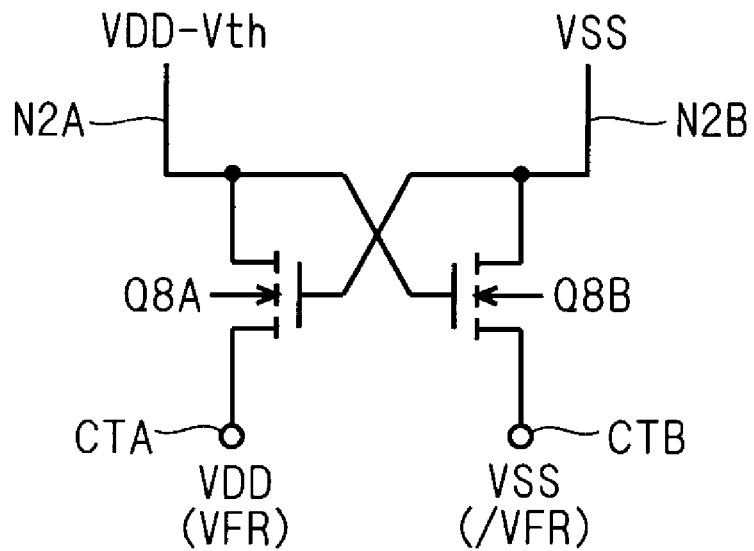
F I G . 3 B
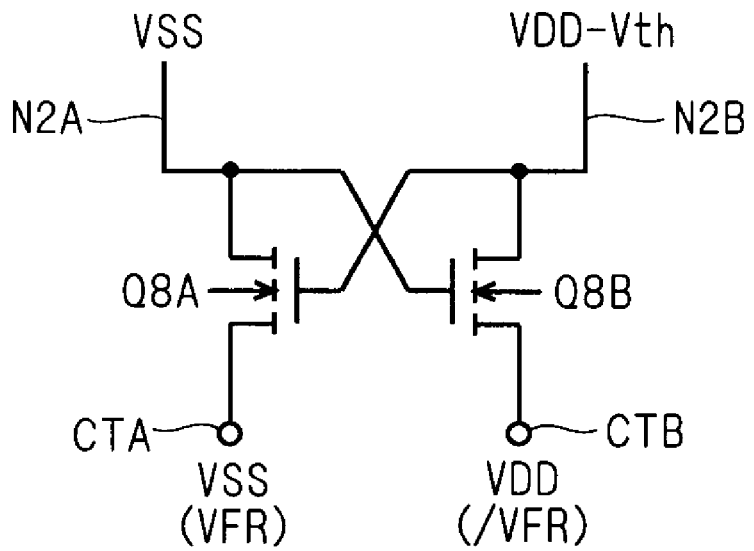

F I G . 6
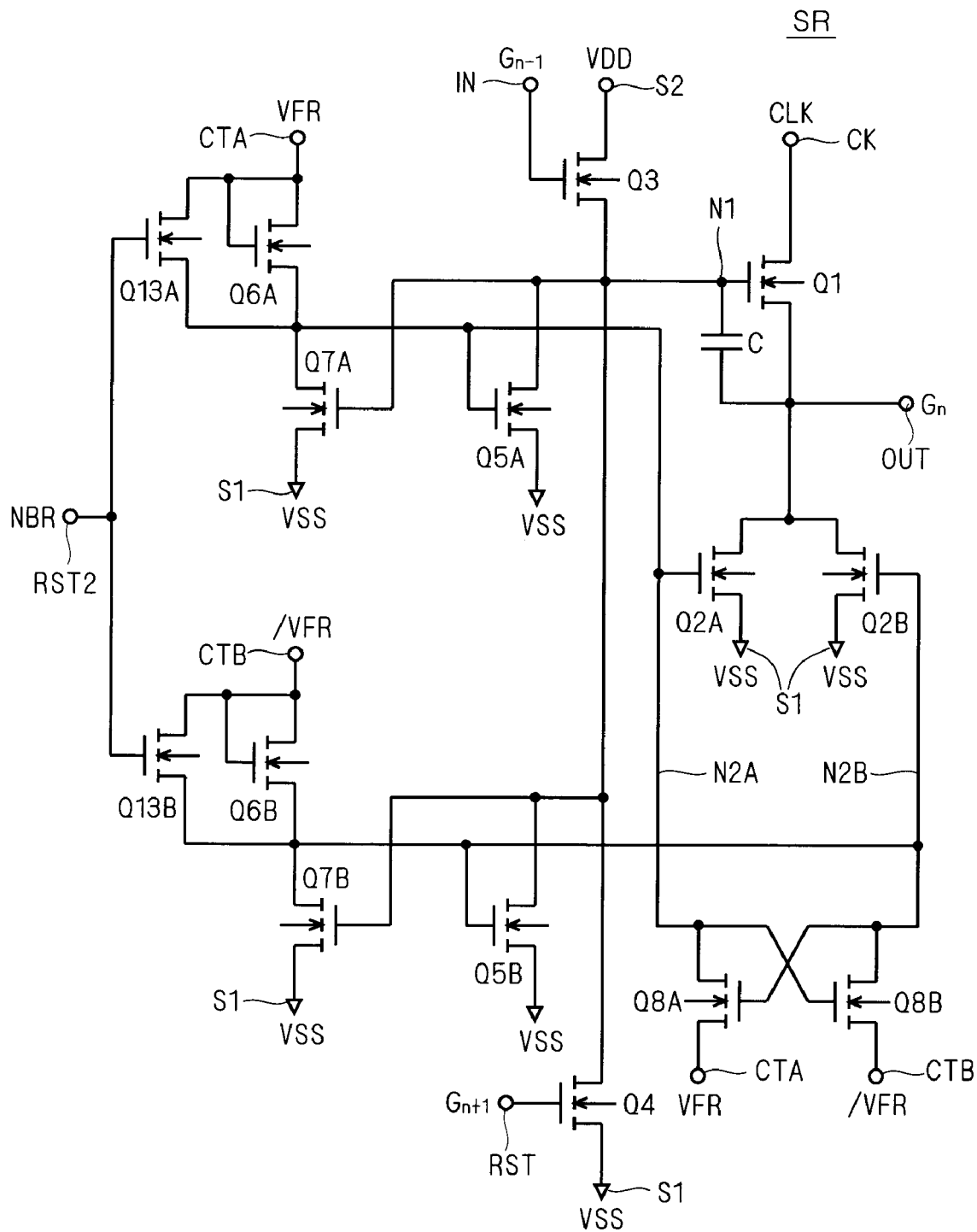

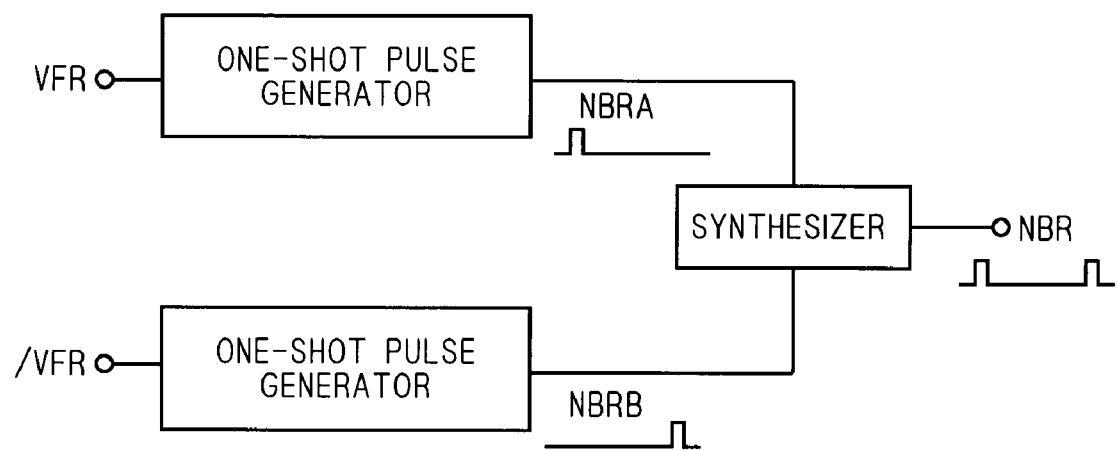
F I G . 1 3

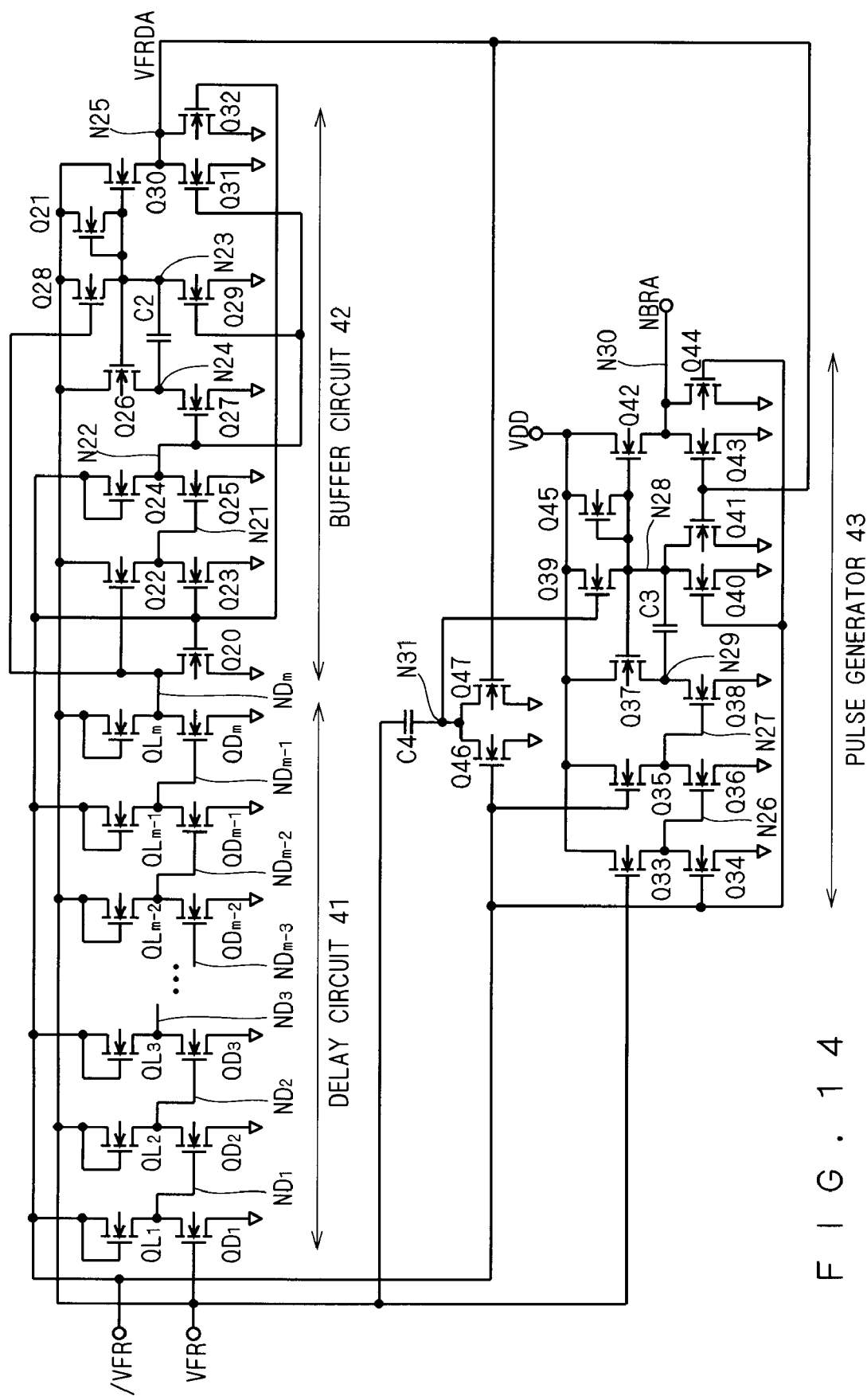
F I G . 1 4

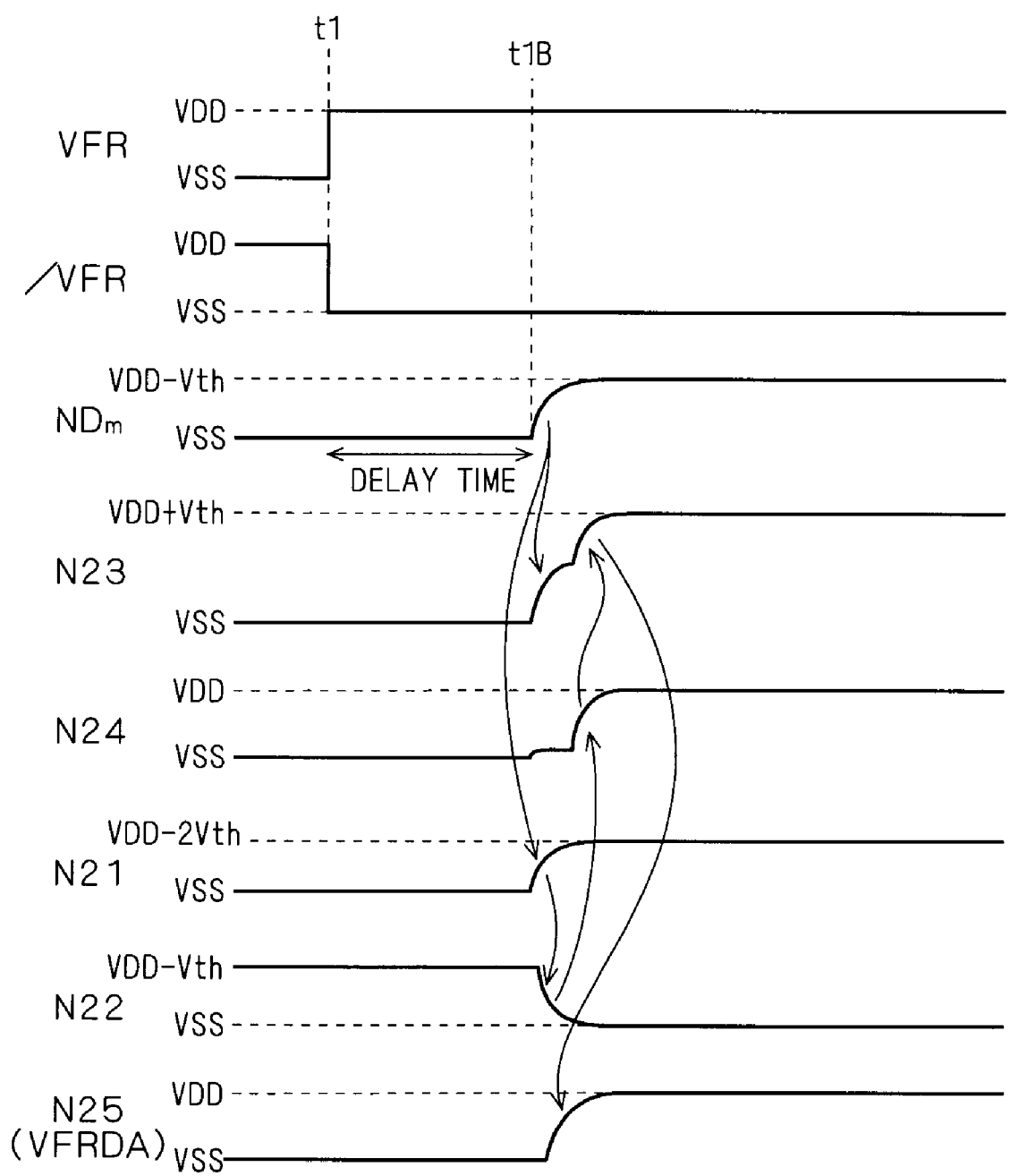

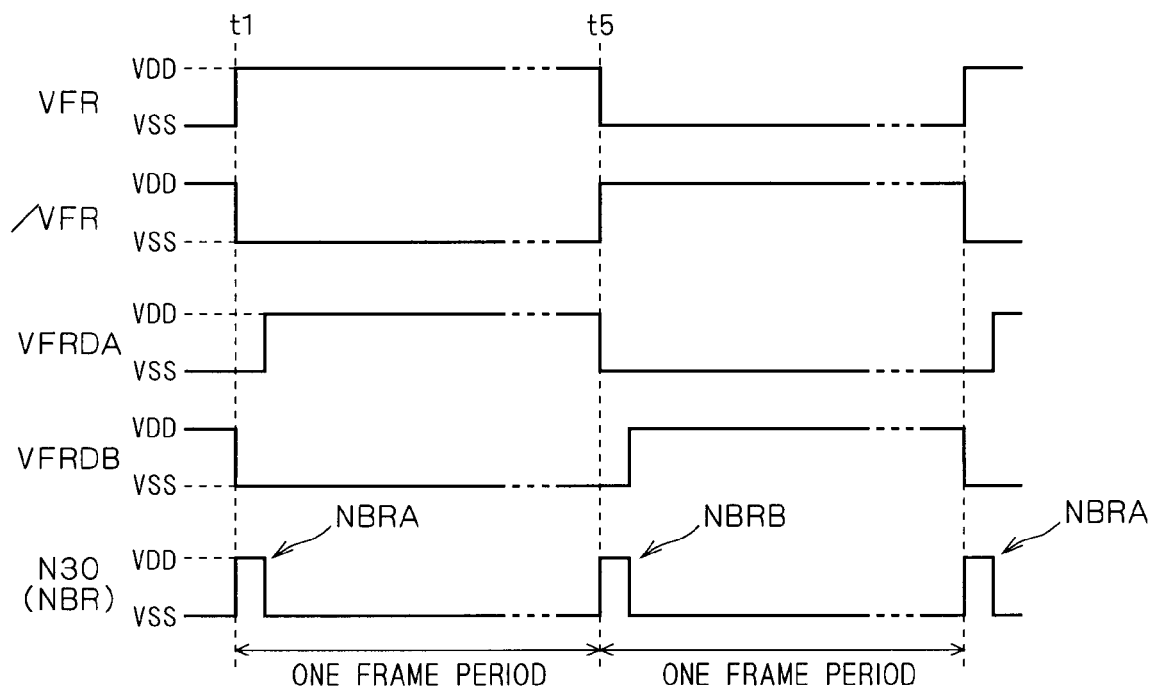
F I G . 1 8

SHIFT REGISTER, IMAGE DISPLAY APPARATUS CONTAINING THE SAME AND SIGNAL GENERATION CIRCUIT

BACKGROUND OF THE INVENTION

1. Field of the Invention

The present invention relates to a shift register, and more particularly, to a shift register for use as a scanning-line driving circuit for an image display apparatus or the like, which is formed by field effect transistors of the same conductivity type only.

2. Description of the Background Art

An image display apparatus (hereinafter referred to as a "display apparatus") such as a liquid crystal display includes a display panel with a plurality of pixels arrayed in a matrix. A gate line (scanning line) is provided for each row of pixels (pixel line) on the display panel, and gate lines are sequentially selected and driven in a cycle of one horizontal period of a display signal, so that a displayed image is updated. As a gate-line driving circuit (scanning-line driving circuit) for sequentially selecting and driving pixel lines, i.e., gate lines, a shift register for performing a shift operation that makes a round in one frame period of a display signal can be used.

To reduce the number of steps in the manufacturing process of a display apparatus, such shift register used as the gate-line driving circuit is preferably formed by field effect transistors of the same conductivity type only. Accordingly, various types of shift registers formed by N- or P-type field effect transistors only and display apparatus containing such shift registers have been proposed (e.g., Soon Young et al., "Highly Stable Integrated Gate Driver Circuit using a-Si TFT with Dual Pull-down Structure" SID 05 DIGEST, pp. 348-351). As a field effect transistor, a metal-oxide-semiconductor (MOS) transistor, a thin film transistor (TFT), or the like is used.

The gate-line driving circuit is formed of a multistage shift register including a plurality of shift registers provided for each pixel line, i.e., each gate line, and connected in cascade (cascade-connected). For ease of description, each of the plurality of shift registers connected in cascade to constitute the multistage shift register will be called "a unit shift register" throughout the present specification.

As shown in FIG. 1 of Japanese Patent Application Laid-Open No. 2004-246358, for example, a typical unit shift register includes, in its output stage, an output pull-up transistor (Q1) connected between an output terminal (GOUT in this document) and a clock terminal (CKV) and an output pull-down transistor (Q2) connected between the output terminal and a reference voltage terminal (VOFF).

In such shift register, the output pull-up transistor turns on and the output pull-down transistor turns off in response to a predetermined input signal (output signal (GOUT$_{N-1}$) from the immediately preceding stage), and a clock signal input to the clock terminal in this mode is transmitted to the output terminal, and an output signal (GOUT$_N$) is then output. During a period in which the above-mentioned input signal is not input, the output pull-up transistor turns off and the output pull-down transistor turns on, so that the voltage level (hereinafter briefly called "level") at the output terminal is kept at the L (low) level.

A display apparatus employing amorphous silicon TFTs (a-Si TFTs) as shift registers of a gate-line driving circuit easily achieves large-area display with great productivity, and is widely used as the screen of a notebook PC, a large-screen display apparatus, etc.

However, an a-Si TFT tends to have its threshold voltage shifted in the positive direction when the gate electrode is continuously positive-biased (dc-biased), resulting in degraded driving capability (current-flowing capability). Particularly, in a unit shift register of a gate-line driving circuit, an output pull-down transistor is turned on so as to output an output signal only in a single selected period per frame of an image and to keep the output terminal at the L level in a period other than that period (non-selected period).

In other words, a conventional unit shift register successively carries out an operation of positively biasing the gate of the output pull-down transistor for a time period almost equal to one frame period (about 16 ms). This causes a shift in threshold voltage (Vth shift) to occur in the output pull-down transistor, which gradually degrades its driving capability (that is, the on-state resistance increases). Then, the output pull-down transistor cannot discharge unnecessary charges if supplied to the output terminal resulting from noise or the like, resulting in a malfunction of erroneous activation of gate line in its non-selected period.

To solve the problem, the aforementioned paper by S. Y. Yoon, et al. presents a gate driver circuit in which dual output pull-down transistors are provided in parallel for the output terminal of the unit shift register and are alternately activated/deactivated by each frame.

In the paper by S. Y. Yoon, et al., for example, each unit shift register as shown in FIG. 4(a) is supplied with two types of signals as shown in FIG. 4(b). These two types of signals are each changed in level per frame so as to activate/deactivate the dual output pull-down transistors. Just after the change in level, each node in the circuit of the unit shift register is making a level transition (on the way of level transition), which may unstabilize the operation of the shift register at that time and cause a malfunction (which will be described later in detail).

It has been found that the above-described problem of Vth shift similarly occurs in an organic TFT, not only in a-Si TFT.

SUMMARY OF THE INVENTION

An object of the present invention is to improve a shift register including two transistors for discharging (pulling down) an output terminal both alternately switched between activation and deactivation, in stability of operation just after the switch.

According to a first aspect of the present invention, the shift register includes a clock terminal and an output terminal, a first transistor configured to supply a clock signal received at the clock terminal to the output terminal, and second and third transistors each configured to discharge the output terminal. The second and third transistors are switched alternately for driving, on the basis of a change in level of a predetermined control signal. Nodes to which control electrodes of the first, second and third transistors are connected are defined as first, second and third nodes, respectively. The shift register further includes a fourth transistor having a control electrode connected to the second node and configured to discharge the first node, and a fifth transistor having a control electrode connected to the third node and configured to discharge the first node. Input of the clock signal to the clock terminal is prohibited at least for one pulse just after the change in level of the predetermined control signal.

Even when the operation of the shift register becomes unstable just after the change in level of the control signal, an error signal is prevented from occurring because input of the clock signal is prohibited.

According to a second aspect of the invention, the shift register includes a clock terminal and an output terminal, a first transistor configured to supply a clock signal received at the clock terminal to the output terminal, and second and third transistors each configured to discharge the output terminal. The second and third transistors are switched alternately for driving, on the basis of a change in level of a predetermined control signal. Nodes to which control electrodes of the first, second and third transistors are connected are defined as first, second and third nodes, respectively. The shift register further includes a fourth transistor having a control electrode connected to the second node and configured to discharge the first node, a fifth transistor having a control electrode connected to the third node and configured to discharge the first node, and a discharging element configured to discharge the first node in a predetermined time period just after the change in level of the control signal on the basis of a reset signal activated in the predetermined time period.

According to a third aspect of the invention, a signal generation circuit supplies the reset signal to the shift register according to the second aspect. The control signal is composed of first and second control signals complementary to each other. The signal generation circuit includes a first delay circuit configured to generate a first delay signal delayed from a time at which the first control signal is activated, a second delay circuit configured to generate a second delay signal delayed from a time at which the second control signal is activated, and a pulse generation circuit configured to generate a pulse signal activated in accordance with activation of the first and second control signals and deactivated in accordance with deactivation of the first and second control signals. The pulse signal is output as the reset signal.

The control electrode of the first transistor (first node) is discharged with low impedance just after the change in level of the control signal, so that the first transistor is kept off with stability. An error signal is therefore prevented from occurring even when the clock signal is input at that time.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3A and 3B are diagrams for explaining the operation of the unit shift register according to the first preferred embodiment;

FIG. 6 is a circuit diagram illustrating the configuration of a unit shift register according to a second preferred embodiment of the present invention;

FIG. 13 is a block diagram illustrating a conceptual configuration of a reset signal generation circuit according to the sixth preferred embodiment;

FIG. 14 is a circuit diagram illustrating the configuration of a one-shot pulse generation circuit according to the sixth preferred embodiment;

FIGS. 15 and 16 are timing charts of the operation of the one-shot pulse generation circuit according to the sixth preferred embodiment;

FIG. 18 is a timing chart of the operation of the reset signal generation circuit according to the sixth preferred embodiment;

DESCRIPTION OF THE PREFERRED EMBODIMENTS

Figure 1:
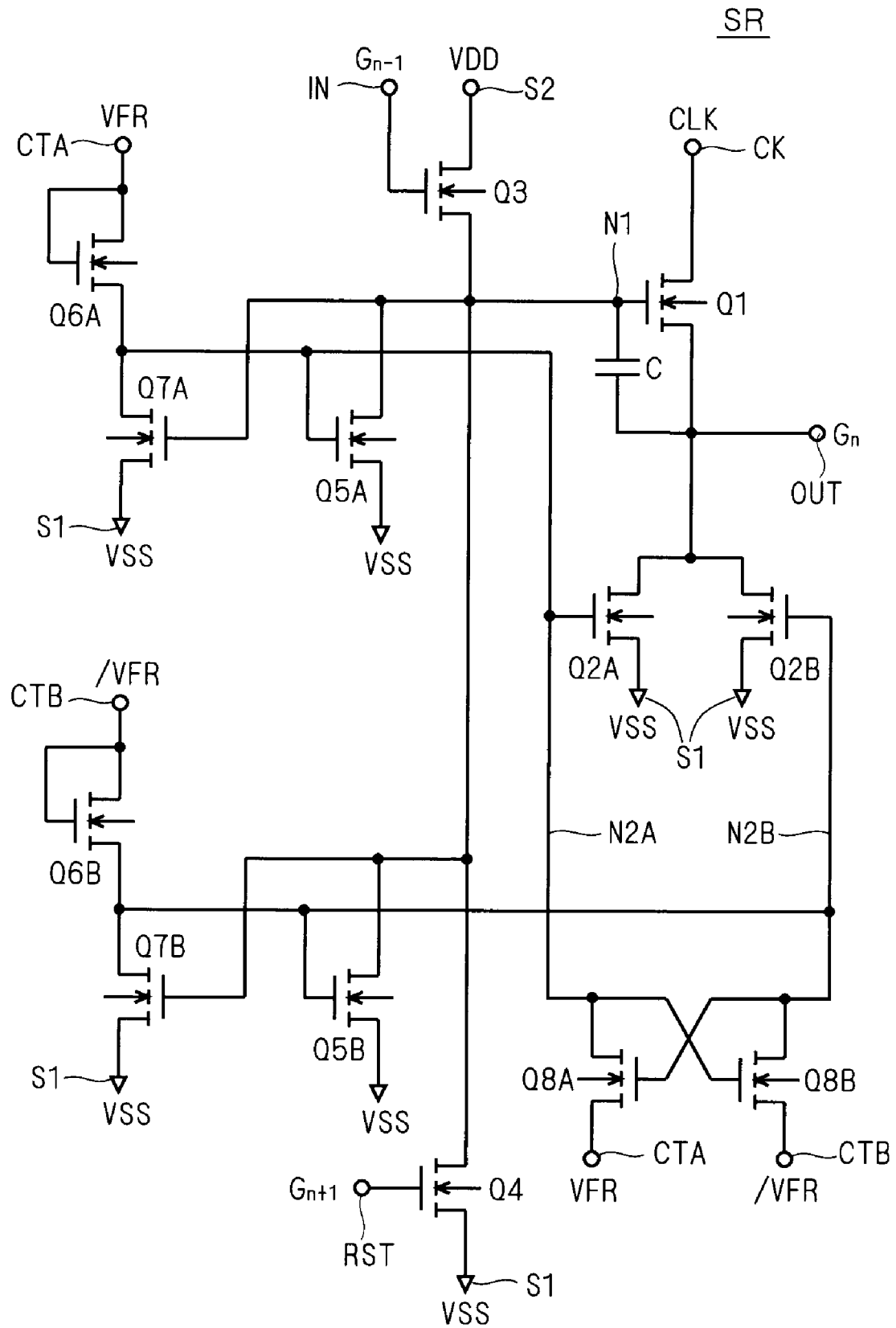
FIG. 1 is a circuit diagram illustrating the configuration of a unit shift register according to a first preferred embodiment of the present invention.

Preferred embodiments of the present invention will be described hereinbelow referring to the accompanied drawings. To avoid repeated and redundant description, elements having the same or equivalent functions are indicated by the same reference characters in the drawings.

First Preferred Embodiment

FIG. 1 is a circuit diagram illustrating the configuration of a unit shift register SR according to a first preferred embodiment of the present invention. The unit shift register SR includes two output pull-down transistors, and alternately activates and deactivates these transistors, to thereby minimize the threshold voltage shift of the output pull-down transistors.

Transistors constituting the unit shift register SR are all field effect transistors of the same conductivity type, and are all assumed to be N-type TFTs herein. The N-type TFT is in the active (on) state when the gate is at the H level with respect to the source, and in the non-active (off) state at the L level. The unit shift register SR may be formed of P-type transistors. The P-type transistor is in the active (on) state when the gate is at the L level with respect to the source, and in the non-active (off) state at the H level.

Figure 2:
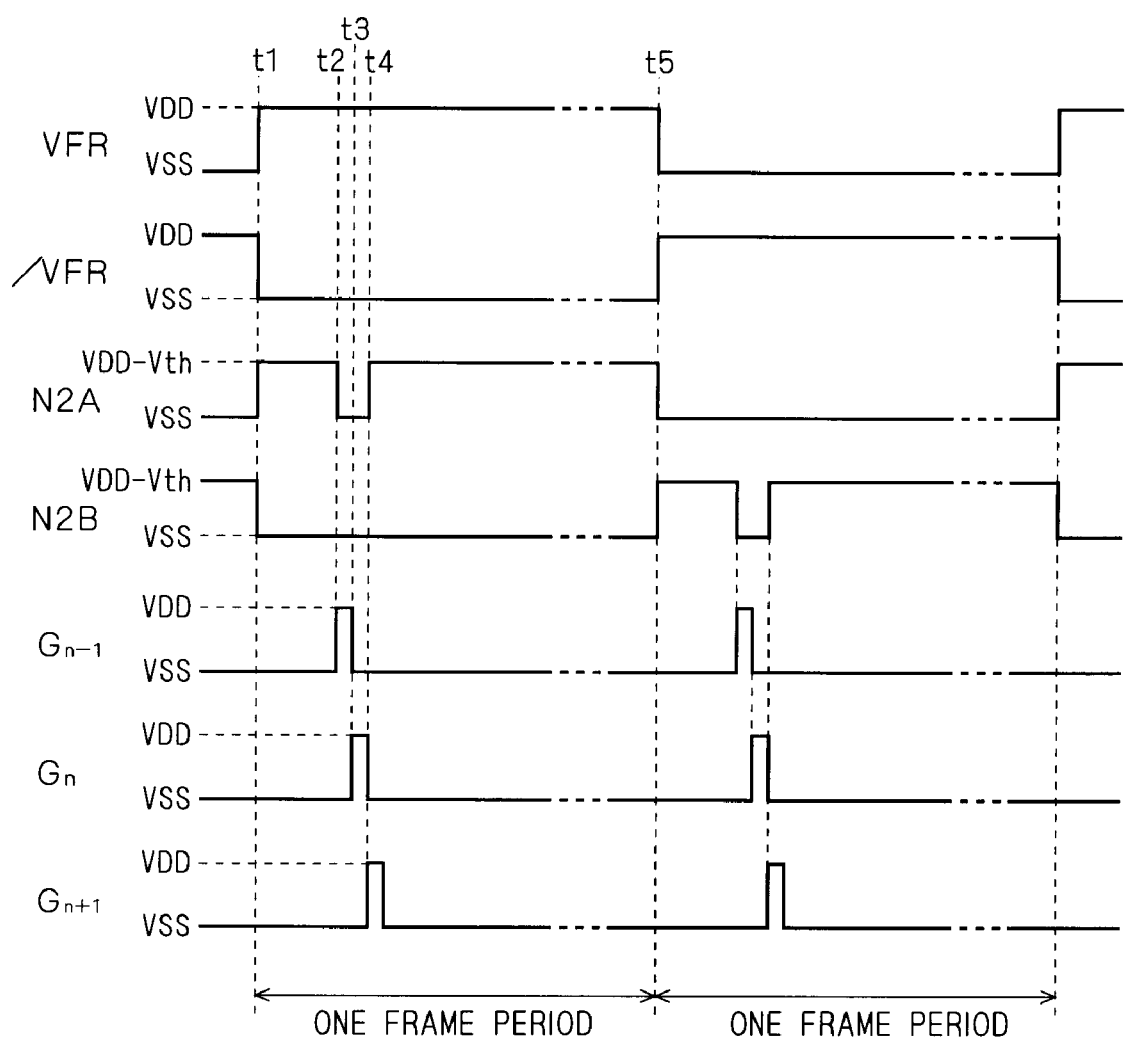
FIG. 2 is a timing chart of the operation of the unit shift register according to the first preferred embodiment.

In the following description, it is assumed that a plurality of unit shift registers SR are connected in cascade to constitute the gate-line driving circuit of a display apparatus. A specific example of the configuration of such display apparatus and gate-line driving circuit is disclosed in patent application gazettes of inventions made by the inventors of the present invention (e.g., Japanese Patent Application No. 2006-277860; FIGS. 1, 2, 13, etc). The low supply voltage VSS will be defined as a reference voltage of the circuit (=0V); in practical use, however, a reference voltage is determined with reference to a voltage of data written into pixels. For example, the high supply voltage VDD may be set at 17V, and the low supply voltage VSS may be set at −12V.

As shown in FIG. 1, the output stage of the unit shift register SR includes a transistor Q1 connected between an output terminal OUT and a clock terminal CK, and transistors Q2A and Q2B both connected between the output terminal OUT and a first power terminal S1. The first power terminal S1 is supplied with the low supply voltage VSS. A second power terminal S2 which will be described later is supplied with the high supply voltage VDD.

More specifically, the transistor Q1 is a first transistor for supplying a clock signal input to the clock terminal CK to the output terminal OUT, and the transistors Q2A and Q2B are second and third transistors, respectively, each supplying the low supply voltage VSS to the output terminal OUT to discharge the output terminal OUT. Hereinafter, a node connected to the gate (control electrode) of the transistor Q1 will be referred to as a "node N1". A node connected to the gate of the transistor Q2A will be referred to as a "node N2A", and a node connected to the gate of the transistor Q2B will be referred to as a "node N2B".

A capacitive element C is provided between the gate and source of the transistor Q1, i.e., between the node N1 and output terminal OUT. The capacitive element C is intended to increase the step-up effect at the node N1 following the level rise at the output terminal OUT. However, the capacitive element C may be omitted and replaced by the gate-to-channel capacitance of the transistor Q1 when it is sufficiently large.

A transistor Q3 having its gate connected to the input terminal IN is connected between the second power terminal S2 supplied with the high supply voltage VDD and node N1. Connected between the node N1 and first power terminal S1 are a transistor Q4 having its gate connected to a first reset terminal RST, a transistor Q5A having its gate connected to the node N2A and a transistor Q5B having its gate connected to the node N2B.

The unit shift register SR further includes a first control terminal CTA supplied with a predetermined first control signal VFR and a second control terminal CTB supplied with a second control signal /VFR. The first and second control signals VFR and /VFR are complementary to each other, and are generated by a driving controller (not shown) for driving the gate-line driving circuit. These first and second control signals VFR and /VFR are controlled to change in level (alternate) in a blanking period between frames of a display image, and for example, change in level per frame of a display image.

A transistor Q8A is connected between the first control terminal CTA and node N2A, and a transistor Q8B is connected between the second control terminal CTB and node N2B. The transistor Q8A has its gate connected to the drain of the transistor Q8B (node N2B), and the transistor Q8B has its gate connected to the drain of the transistor Q8A (node N2A). In other words, the transistors Q8A and Q8B constitute what is called a flip-flop circuit each having one main electrode (herein, drain) connected to the control electrode (gate) of each other in a crossed manner.

A diode-connected transistor Q6A is connected between the node N2A and first control terminal CTA. A transistor Q7A is connected between the node N2A and first power terminal S1, and has its gate connected to the node N1. The transistor Q7A has an on-state resistance set sufficiently smaller than that of the transistor Q6A, and these transistors Q6A and Q7A constitute a ratio inverter in which the node N1 serves as the input node and the node N2A serves as the output node, but the inverter is supplied with power from the first control signal VFR unlike a typical inverter.

A diode-connected transistor Q6B is connected between the node N2B and second control terminal CTB. A transistor Q7B is connected between the node N2B and first power terminal S1, and has its gate connected to the node N1. These transistors Q6B and Q7B also constitute a ratio inverter in which the node N1 serves as the input node and the node N2B serves as the output node, but the inverter is supplied with power from the second control signal /VFR unlike a typical inverter. Hereinafter, the inverter formed of the transistors Q6A and Q7A will be called "a first inverter", and the inverter formed of the transistors Q6B and Q7B will be called "a second inverter".

As described earlier, the present embodiment will be described assuming that unit shift registers SR, each as shown in FIG. 1, constitute a multistage shift register as the gate-line driving circuit of the display apparatus.

The multistage shift register is formed of a plurality of unit shift registers SR connected in cascade. More specifically, an output signal G from a unit shift register SR of each stage is input to an input terminal IN of a unit shift register SR of the immediately succeeding stage. In other words, the input terminal IN of each shift register SR receives the output signal G from the immediately preceding stage.

In the gate-line driving circuit, "a start pulse" which is a pulse signal corresponding to the head of each frame period of an image signal is input to the input terminal IN of the unit shift register $SR_1$ of the forwardmost shift register (of the first stage). The unit shift register SR is provided for each pixel line, i.e., each gate line, and the output signal G from each unit shift register SR is a horizontal (or vertical) scanning pulse for activating a corresponding gate line.

In the present embodiment, the gate-line driving circuit (multistage shift register) shall be driven by two-phase clock signals CLK and /CLK of opposite phases to each other (whose active periods kept at the H level do not coincide with each other). In this case, the clock terminal CK of each stage receives a clock signal of opposite phase to that input to the immediately preceding stage. For instance, assuming that odd-numbered stages receive the clock signal CLK, even-numbered stages receive the clock signal /CLK. When the shift register is driven by the two-phase clock signals CLK and /CLK, the first reset terminal RST of each unit shift register SR receives the output signal G from the immediately succeeding stage (e.g., cf. FIG. 13 of JP2006-277860).

The first control signal VFR is input to the first control terminal CTA of each of the unit shift registers SR connected in cascade, and the second control signal /VFR is similarly input to the second control terminal CTB of each of the unit shift registers SR connected in cascade.

The operation of the unit shift register SR according to the present embodiment shown in FIG. 1 will now be described.

All of the cascade-connected unit shift registers SR of the respective stages basically operate in the same way, and the operation of the unit shift register $SR_n$ of the n-th stage will be described herein as a representative example. For ease of description, it is assumed that the first clock terminal CK of the unit shift register $SR_n$ receives the clock signal CLK. That is, the unit shift register $SR_{n-1}$ of the immediately preceding (n−1)th stage and the unit shift register $SR_{n+1}$ of the immediately succeeding (n+1)th stage each receive the clock signal /CLK.

The clock signals CLK, /CLK and first and second control signals VFR, /VFR at the H level are all assumed to be equal to the high supply voltage VDD. The first and second control signals VFR and /VFR shall each be controlled to change in level with timing in a blanking period per frame of a display image. Further, threshold voltages of respective transistors constituting the unit shift register SR are all assumed to have the same value, Vth.

FIG. 2 is a timing chart showing the basic operation of the unit shift register $SR_n$ shown in FIG. 1. The basic operation of the unit shift register $SR_n$ shown in FIG. 1 according to the present embodiment will now be described.

Time t1 shown in FIG. 2 is in the blanking period (not shown) between frame periods. It is assumed that the first control signal VFR rises to the H level and the second control signal /VFR drops to the L level at time t1.

Then, in each unit shift register SR, the drain and gate of the transistor Q6A change from VSS (=0) to VDD, causing the transistor Q6A to turn on. In other words, power is supplied to the first inverter formed of the transistors Q6A and Q7A, so that the first inverter is activated. At this time, the transistor Q5B is on, and the node N1 is at the L level. Thus, the turning-on of the transistor Q6A causes the node N2A to rise in level since the transistor Q7A is off.

Since the second control signal /VFR is input to the second control terminal CTB, the drain and gate of the transistor Q6B changes from VDD to VSS. In other words, power is not supplied to the second inverter formed of the transistors Q6B and Q7B. As the transistor Q6B serves as a diode in which the direction from the second control terminal CTB to the node N2B is the forward direction, charges at the node N2B are not discharged through the transistor Q6B. As described above, however, since the node N2A rises in level and the source of the transistor Q8B (second control terminal CTB) is at VSS, the transistor Q8B turns on, causing the node N2B to drop to the L level (VSS). The transistor Q8A accordingly turns off, causing the node N2A to rise to the H level (VDD−Vth). That is, the potential distribution in the flip-flop circuit formed of the transistors Q8A and Q8B is as shown in FIG. 3A after time t1.

When the first control signal VFR is at the H level and the second control signal /VFR is at the L level in this manner, the second inverter is not activated in each unit shift register SR, causing the node N2B to be kept at the L level. Therefore, the transistors Q2B and Q5B are not biased at the gate, and thus are deactivated during that period. In other words, a combination of the transistors Q1, Q2A, Q3, Q4, Q5A, Q6A and Q7A constitutes a circuit equivalent to a typical unit shift register SR (the circuit shown in FIG. 1 of the aforementioned paper by S.Y. Yoon, et al.) in each unit shift register SR during that period, and is capable of performing a similar operation to the typical unit shift register SR.

Focusing attention to the unit shift register $SR_n$ of the n-th stage, when the output signal $G_{n-1}$ from the immediately preceding stage rises to the H level at time t2 at which the gate line driven by the unit shift register $SR_{n-1}$ of the immediately preceding stage is brought into the selected period, the transistor Q3 turns on. At this time, the transistor Q5A is also on, however, the node N1 rises to the H level (VDD−Vth) since the transistor Q3 is set to have an on-state resistance sufficiently smaller than that of the transistor Q5A. Accordingly, the transistor Q1 turns on. Hereinafter, the state where the node N1 is at the H level (where the transistor Q1 is on) will be called a "set mode".

In the first inverter formed of the transistors Q6A and Q7A, the node N1 serves as the input node, and the node N2A serves as the output node. Thus, when the node N1 rises to the H level, the node N2A drops to the L level. The transistors Q2A and Q5A accordingly turn off. Here, since the first inverter is a ratio inverter, the potential of the L level output is a value determined by the ratio between the on-state resistances of the transistors Q6A and Q7A. That is, the transistors Q6A and Q7A both turn on during a period in which the node N2A is at the L level, causing a short circuit current to flow from the first control terminal CTA to the first power terminal S1 through the transistors Q6A and Q7A, whereby a certain amount of power is consumed.

Thereafter, when the output signal $G_{n-1}$ from the immediately preceding stage returns to the L level, the transistor Q3 turns off, but the node N1 is brought into a floating state, so that the node N1 is kept at the H level. Then, when the clock signal CLK rises to the H level at time t3 at which the gate line driven by the unit shift register $SR_n$ is brought into the selected period, the clock signal CLK at the H level is supplied to the output terminal OUT since the transistor Q1 is on, causing the output signal $G_n$ to rise to the H level.

At this time, the node N1 is raised in level by means of the capacitive coupling between the capacitive element C and gate-to-channel capacitance of the transistor Q1 in accordance with the rise in level of the output signal $G_n$. Accordingly, the source-to-gate voltage of the transistor Q1 is maintained high, so that the transistor Q1 is maintained at a low impedance. Therefore, the output signal $G_n$ quickly follows the level of the clock signal CLK. The output signal $G_n$ thus quickly returns to the L level when the clock signal CLK returns to the L level.

Then, when the output signal $G_{n+1}$ from the unit shift register of the immediately succeeding stage rises to the H level at time t4 at which the gate line driven by the unit shift register $SR_{n+1}$ is brought into the selected period, the transistor Q4 turns on in the unit shift register $SR_n$. The node N1 accordingly drops to the L level, causing the transistor Q1 to turn off again. Hereinafter, the state where the node N1 is at the L level (where the transistor Q1 is off) will be called a "reset mode".

At this time, the transistor Q7A also turns off, causing the node N2A to return to the H level (VDD−Vth). As a result, the transistor Q2A turns on, allowing the output terminal OUT to be kept at the L level with low impedance. The transistor Q5A also turns on at this time. This transistor Q5A is intended to keep the node N1 at the L level with low impedance while the node N2A is at the L level. Therefore, the node N1 is prevented from rising in level under the influence of noise and the like in the non-selected period, which prevents the unit shift register SR from malfunctioning.

Thereafter, this state is maintained in the unit shift register $SR_n$ until the first control signal VFR and second control signal /VFR are inverted in level at time t5 in the next blanking period.

Then, when the first control signal VFR drops to the L level, and the second control signal /VFR rises to the H level at time t5, the second inverter formed of the transistors Q6B and Q7B is activated in each unit shift register SR contrary to what is was, causing the node N2B to rise to the H level. The transistor Q8A accordingly turns on, and the first inverter is deactivated, causing the node N2A to drop to the L level (VSS).

That is, the potential distribution in the flip-flop circuit formed of the transistors Q8A and Q8B is as shown in FIG. 3B during a period after time t5 in which the first control signal VFR is at the L level and the second control signal /VFR is at the H level. During that period, the transistors Q2A and Q5A are not biased at the gate, and thus are deactivated. Further, the first inverter is supplied with no power, thus not operating. As a result, in the unit shift register SR, a combination of the transistors Q1, Q2B, Q3, Q4, Q5B, Q6B and Q7B constitutes a circuit equivalent to the typical unit shift register SR (the circuit shown in FIG. 1 of the aforementioned paper by S. Y. Yoon, et al.), whereby similar operations to those from time t2 to t5 are performed.

As described, the unit shift register SR shown in FIG. 1 is capable of performing similar operations as in the typical unit shift register. In addition, the pair of the transistors Q2A and Q5A and the pair of the transistors Q2B and Q5B are alternately deactivated every time the first control signal VFR and second control signal /VFR are inverted in level, which prevents the gates of those transistors from being dc-biased. This can prevent the unit shift register SR from malfunctioning due to the threshold voltage shift of a-Si TFTs, which achieves improved operational reliability.

The operation of the unit shift register SR described above is in the state where the first and second control signals VFR and /VFR are steadily at VDD or VSS after the change in level.

The unit shift register SR shown in FIG. 1 is capable of performing a similar operation to the typical unit shift register as described above during the period in which the first and second control signals VFR and /VFR are steadily at VDD or VSS. As described earlier, however, just after the change in level of the first and second control signals VFR and /VFR, each node in the circuit of each unit shift register is making a level transition, which may unstabilize the operation of the shift register at that time, and cause a malfunction.

Figure 4:
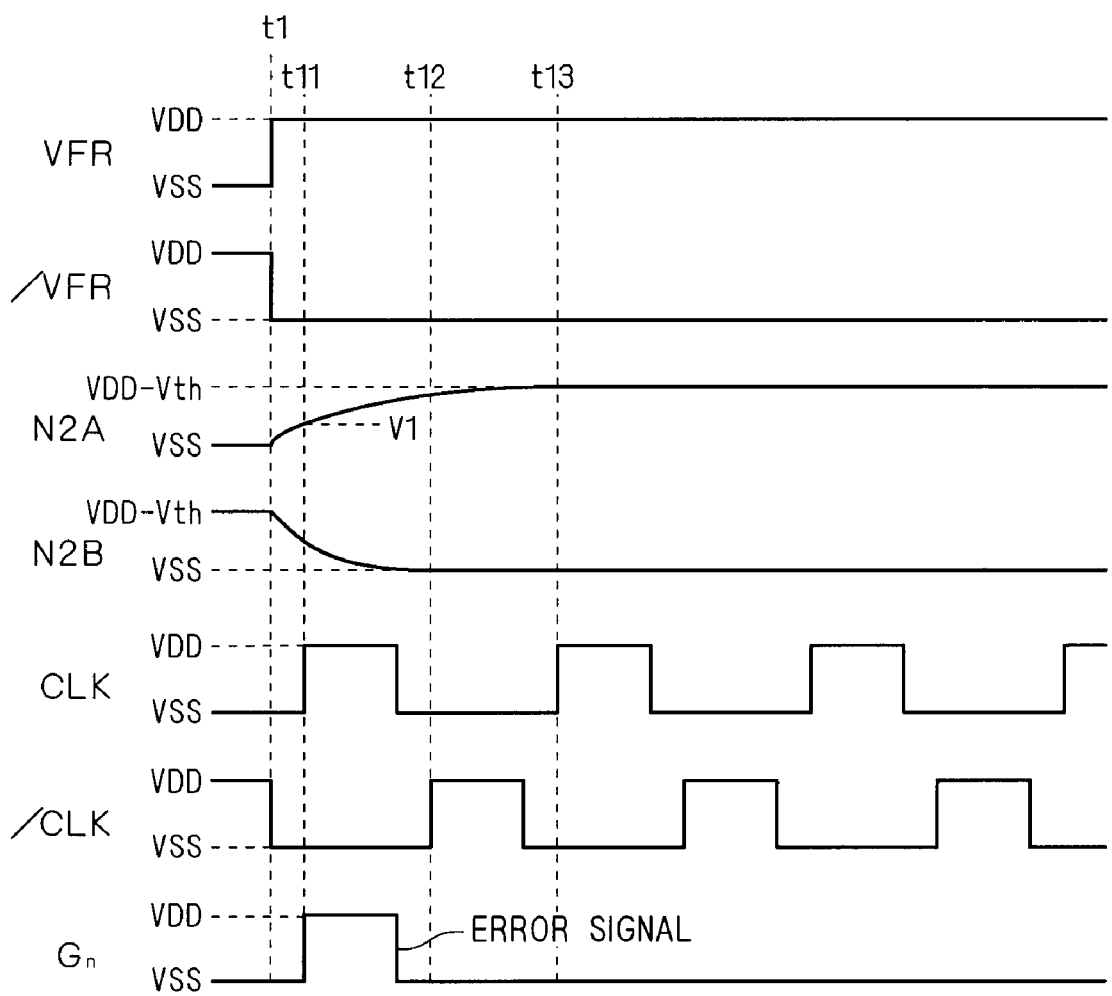
FIG. 4 is a timing chart for explaining the problem of malfunction in a conventional unit shift register just after the change in level of first and second control signals.

FIG. 4 is a timing chart for explaining the problem of malfunction in a conventional unit shift register SR just after the change in level of first and second control signal. This chart shows the behavior of the unit shift register $SR_n$ at the change in level of the first and second control signals VFR and /VFR.

Time t1 shown in FIG. 4 corresponds to time t1 shown in FIG. 2. More specifically, time t1 is in the blanking period, at which the first control signal VFR changes from the L level to the H level and the second control signal /VFR changes from the H level to the L level.

The unit shift register $SR_n$ of the n-th stage will also be described herein as a representative example. When the first control signal VFR rises to the H level and the second control signal /VFR drops to the L level at time t1, the transistor Q6A turns on and the transistor Q6B turns off in the unit shift register $SR_n$.

Then, the node N2A starts to change from the L level (VSS) to the H level. As a result, the voltage between the gate (node N2A) and source (second control terminal CTB) of the transistor Q8B increases, causing current to flow into the transistor Q8B, so that the node N2B accordingly drops from the H level (VDD−Vth). Finally, the level at the node N2A reaches VDD−Vth, and the node N2B reaches VSS.

It is herein assumed that the time at which the clock signals CLK and /CLK are supplied and the time at which the first and second control signals VFR and /VFR change in level are independent of each other, and that the clock signal CLK rises at time t11 before the node N2A reaches the final level (VDD−Vth), as shown in FIG. 4, for example. At this time, the node N2A is at a potential V1 lower than the final level.

When the clock signal CLK rises at time t11, the node N1 is going to rise in level by means of the gate-to-drain overlap capacitance of the transistor Q1 in accordance with the rising of the clock signal CLK. Since the unit shift register $SR_n$ is in the non-selected state at this time (all the unit shift registers SR are in the non-selected state in the blanking period), the output signal $G_n$ should be kept at the L level. When the rise in level of the node N1 is great, however, the transistor Q1 accordingly turns on, causing the clock signal CLK to be transmitted to the output terminal OUT, which results in a malfunction that the output signal $G_n$ as an error signal is output as shown in FIG. 4.

Such malfunction should essentially be prevented by the transistors Q5A and Q5B. Either the transistor Q5A or Q5B turns on in the non-selected period of the unit shift register $SR_n$ (which one is to turn on is changed by the first and second control signals VFR and /VFR) to bring the node N1 into the L level with low impedance. Therefore, the node N1 is kept at the L level when the transistors Q5A and Q5B operate normally, where the above-described malfunction should not occur.

Referring again to FIG. 4, the node N2A does not rise in level sufficiently at time t11 at which the clock signal CLK rises. The transistor Q5A is controlled by the level at the node N2A, and thus does not turn on sufficiently at that time and has a high resistance. On the other hand, the node N2B drops in level to some degree by time t11, and the transistor Q5B has a high resistance.

The node N1 is therefore in the high impedance state and likely to rise in level in accordance with the rising of the clock signal CLK until the node N2A sufficiently rises in level. In other words, the unit shift register $SR_n$ is in an unstable state that is likely to output the output signal $G_n$ as the error signal shown in FIG. 4. Particularly when the transistors Q5A and Q5B are continuously subjected to a temperature stress and a voltage stress, their threshold voltages shift to the positive side, causing their on-state resistances to become higher, where the above problem becomes significant.

This problem arises not only in the case of FIG. 4 shown by way of example, but also in a case where either the clock signal CLK or /CLK rises before completion of the change in level of the nodes N2A and N2B after and in accordance with the change in level of the first and second control signals VFR and /VFR.

When the rising rate of the node N2A is decreased further in the example shown in FIG. 4, a unit shift register SR (e.g., unit shift registers $SR_{n-1}$ and $SR_{n+1}$ adjacent to the unit shift register $SR_n$) receiving the clock signal /CLK at the clock terminal CK also outputs an error signal at time t12 at which the clock signal /CLK rises first after time t1.

Since the change in level of the first and second control signals VFR and /VFR occurs in the blanking period, an error signal appearing in that period may be considered not to cause display malfunctions, but such error signal actually causes display malfunctions when a normal display period is brought about on the way of shift of the error signal through the multistage shift register.

Measures to overcome this problem include the method of reducing the on-state resistances of the transistors Q6A and Q6B and increasing the charging rate of the nodes N2A and N2B. However, reducing the on-state resistances of the transistors Q6A and Q6B requires the on-state resistances of the transistors Q7A and Q7B to be reduced at the same rate since the transistors Q6A and Q6B each constitute a ratio inverter together with the transistors Q7A and Q7B, respectively.

Reducing the on-state resistance of a transistor requires size increase of the transistor, and therefore, this method is not desirable in that the circuit area increases. Further, reducing the on-state resistances of the transistors Q6A, Q6B, Q7A and Q7B causes the problem of increasing the current flowing into the first and second inverters, thus increasing power consumption.

Figure 5:
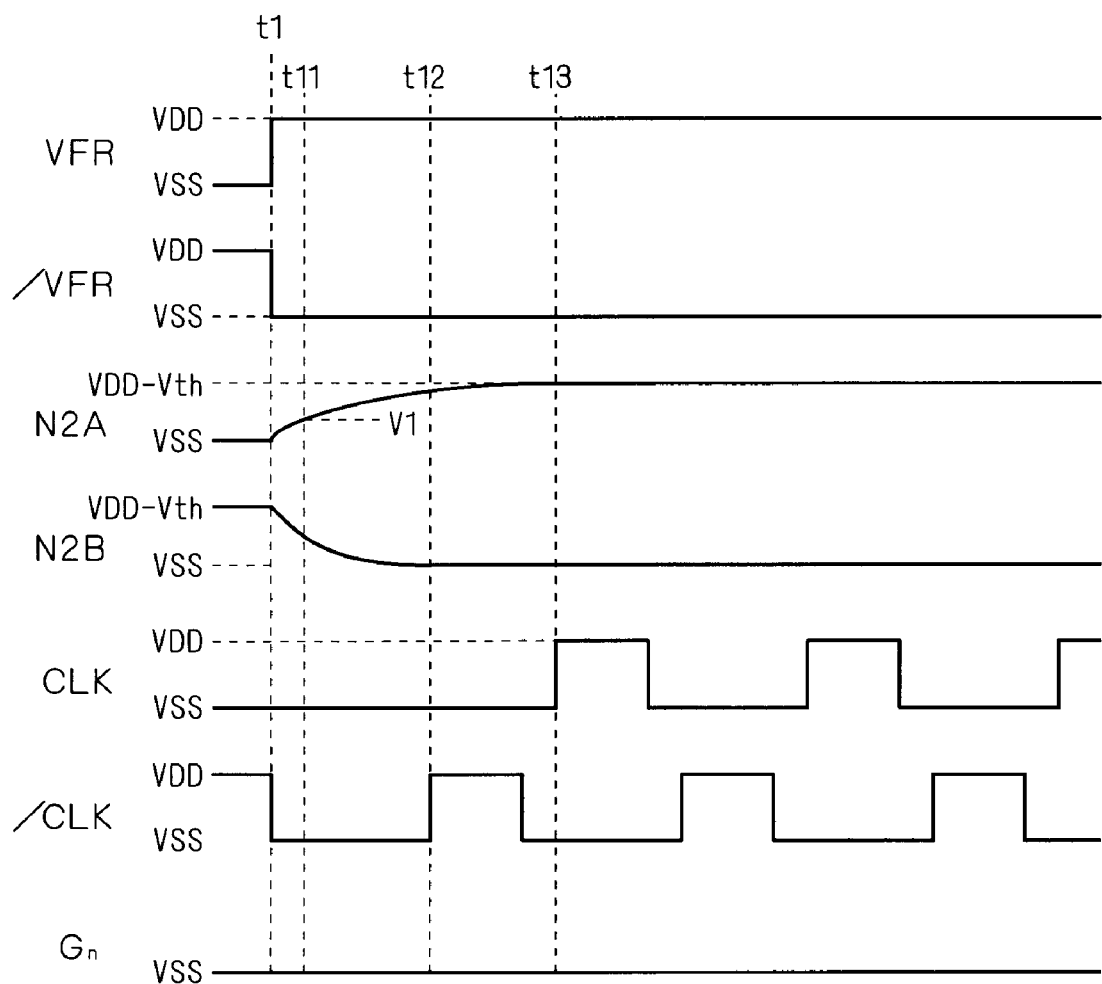
FIG. 5 is a timing chart for explaining the method of driving the unit shift register according to the first preferred embodiment.

The first preferred embodiment presents a shift register capable of solving these problems. FIG. 5 is a timing chart for explaining the method of driving the unit shift register according to the first preferred embodiment.

As is apparent from the comparison with FIG. 4, in the present embodiment, a clock signal generation circuit (not shown) for supplying the clock signals CLK and /CLK to the unit shift register SR prohibits the clock signal CLK from rising at time t11 just after the change in level of the first and second control signals VFR and /VFR (at time t1), that is, prohibits the clock signals CLK and /CLK from being input to the unit shift register SR.

The error signal shown in FIG. 4 (output signal $G_n$) results from the rising of the clock signal CLK at time t11 as described above, and can therefore be prevented from occurring by prohibiting the rising of the clock signal CLK. An error signal does not occur at time t13 at which the clock signal CLK rises first after time t1 because the node N2A has sufficiently risen.

When the node N2A rises extremely slowly as described above, a unit shift register SR (e.g., unit shift registers $SR_{n-1}$ and $SR_{n+1}$ adjacent to the unit shift register $SR_n$) receiving the clock signal /CLK at the clock terminal CK might also output an error signal. In that case, prohibiting the rising of the clock signal /CLK at time t13 as well can prevent such error signal from occurring.

According to the present embodiment as described above, the clock signal generation circuit for supplying the clock signals CLK and /CLK to the unit shift register SR prohibits the supply of one or both of the clock signals CLK and /CLK for a pulse just after the change in level of the first and second control signals VFR and /VFR. That is, the clock signals CLK and /CLK are prevented from being input to the unit shift register SR whose operation is unstable just after the change in level of the first and second control signals VFR and /VFR. As a result, the aforementioned error signal is prevented from occurring, thus achieving improved operational reliability of the unit shift register SR. Further, display malfunctions are prevented from occurring in a display apparatus having a gate-line driving circuit formed of such unit shift registers SR mounted thereon.

The above description has shown the example in which the supply of one or both of the clock signals CLK and /CLK is prohibited for a pulse just after the change in level of the first and second control signals VFR and /VFR, but may be prohibited for two pulses or longer. The number of pulses shall be determined in accordance with the rising rates of the nodes N2A and N2B in each unit shift register SR at the time when the first and second control signals VFR and /VFR change in level. In other words, when a time period until these nodes sufficiently rise in level is long, the number of pulses for which the supply of the clock signals is prohibited may be increased accordingly.

Second Preferred Embodiment

As described above, the problem of the error signal occurring just after the change in level of the first and second control signals VFR and /VFR results from the low rate of change in level of the nodes N2A and N2B. A second preferred embodiment will therefore present a unit shift register SR in which the nodes N2A and N2B change in level at high speeds just after the change in level of the first and second control signals VFR and /VFR.

FIG. 6 is a circuit diagram illustrating the configuration of a unit shift register SR according to the second preferred embodiment. The unit shift register SR includes transistors Q13A and Q13B added to the first and second inverters, respectively, in the circuit shown in FIG. 1.

The transistor Q13A added to the first inverter is connected between the first control terminal CTA supplied with the first control signal VFR and node N2A serving as the output node of the second inverter. The transistor Q13B added to the second inverter is connected between the second control terminal CTB supplied with the second control signal /VFR and node N2B serving as the output node of the first inverter. These transistors Q13A and Q13B are set to have a sufficiently greater driving capability (i.e., a sufficiently smaller on-state resistance) than the transistors Q6A and Q6B, respectively.

The transistors Q13A and Q13B have their gates connected to a second reset terminal RST2 supplied with a predetermined reset signal NBR. This reset signal NBR is activated (brought into the H level) for a certain time period just after the change in level of the first and second control signals VFR and /VFR, and generated by a signal generation circuit (not shown) provided externally to the shift register.

Figure 7:
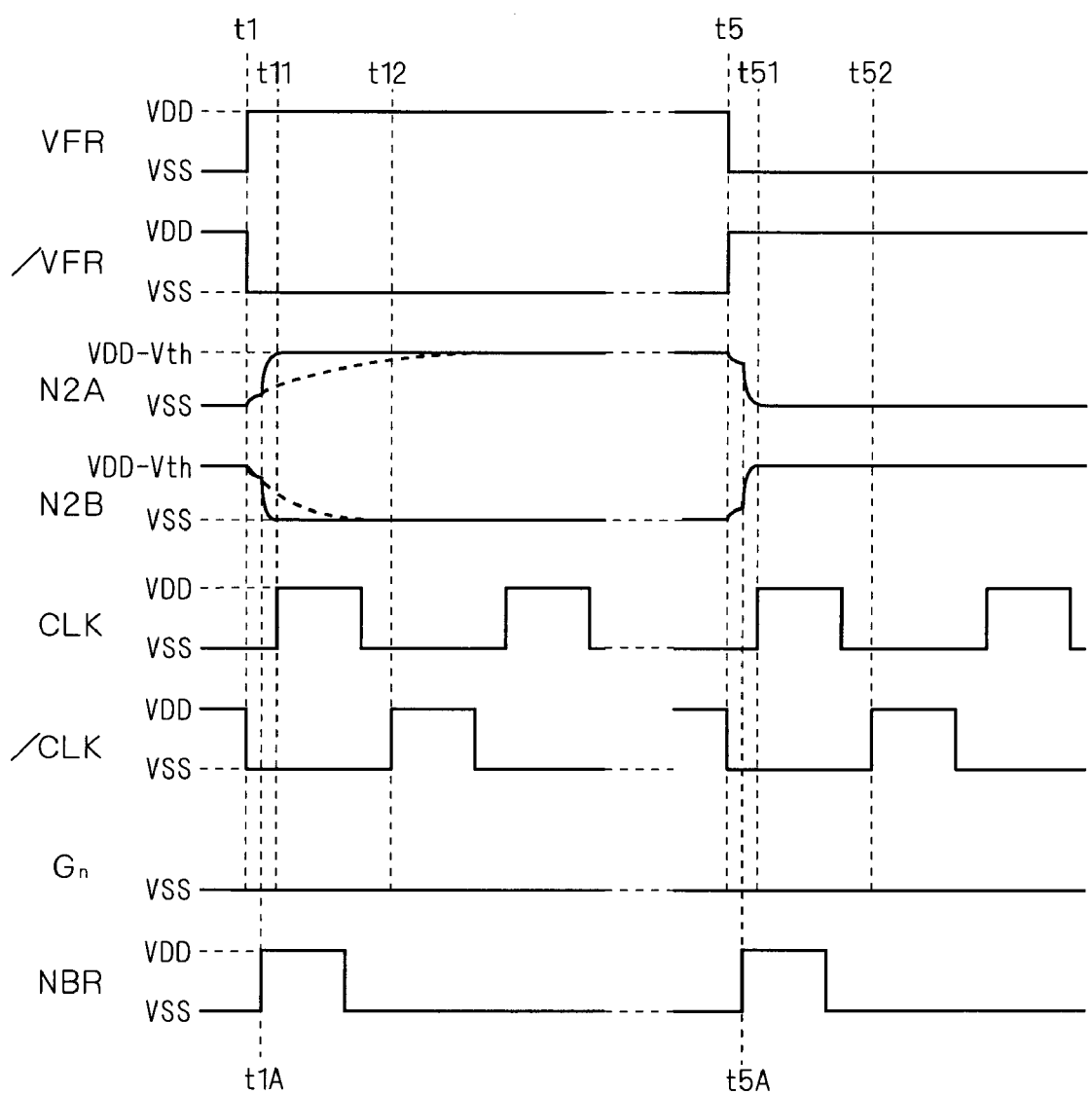
FIG. 7 is a timing chart of the operation of the unit shift register according to the second preferred embodiment.

FIG. 7 is a timing chart of the operation of the unit shift register SR shown in FIG. 6. In the present embodiment, the supply of the clock signals CLK and /CLK is not prohibited for several pulses after the change in level of the first and second control signals VFR and /VFR as in the first preferred embodiment.

In FIG. 7, it is also assumed that the first control signal VFR changes to the H level and the second control signal /VFR changes to the L level at time t1 in the blanking period. The reset signal NBR is at the H level for a certain time period from time t1A just after time t1. When the reset signal NBR rises to the H level, the transistors Q13A and Q13B of the unit shift register SR turn on. Since the transistor Q13A has a smaller on-state resistance, the node N2A is charged at high speeds to rise to the H level in a short time period. When the node N2A rises at higher speeds, the transistor Q8B sufficiently turns on in a shorter time period, thus increasing the falling rate of the node N2B to the L level.

High-speed rising of the node N2A to the H level allows the transistor Q5A to sufficiently turn on before time t11 at which the clock signal CLK rises and brings the node N1 into the L level with low impedance. This prevents the node N1 from rising in level even when the clock signal CLK rises at time t11, thus preventing the occurrence of an error signal.

The reset signal NBR rises to the H level just after the change in level of the first and second control signals VFR and /VFR, and thereafter rises to the H level again at time t5 (corresponding to time t5 shown in FIG. 2) when the first control signal VFR changes to the L level and the second control signal /VFR changes to the H level. This increases the rate of change in level of the nodes N2A and N2B just after time t5, thus bringing the node N1 into the L level with low impedance at high speeds, which prevents the occurrence of an error signal.

In the present embodiment, the transistors Q13A and Q13B charge the node N2A or N2B at high speeds on the basis of the reset signal NBR. The transistor Q5A or Q5B thereby turns on quickly and sufficiently, to become capable of discharging the node N1. In this manner, the transistors Q13A and Q13B themselves carry out charging rather than a discharging operation, but serve as discharging means for indirectly discharging the node N1 at high speeds using the transistor Q5A or Q5B.

In the present embodiment, the time at which the reset signal NBR rises (time t1A) is earlier than the time at which the clock signals CLK and /CLK rise (time t11), but the order of rising may be reversed in the case, for example, where the time at which the first and second control signals VFR and /VFR change in level and the time at which the clock signals CLK and /CLK change in level are independent of each other. It is needless to say that the node N1 is prevented from rising in level more efficiently when the reset signal NBR rises to the H level earlier than the rising of the clock signals CLK and /CLK, however, similar effects can also be obtained in the opposite case. Even if an error signal comes close to occurring by the action of the clock signals CLK and /CLK having risen earlier than the reset signal NBR, the occurrence thereof can be minimized by bringing the node N1 of each unit shift register SR into the L level with low impedance at high speeds to turn off the transistor Q1.

The reset signal NBR only needs to be at the H level for a certain time period just after the change in level of the first and second control signals VFR and /VFR, and the time at which it falls (time t1A) may be set earlier than the time at which the first and second control signals VFR and /VFR change in level (time t1). More specifically, the time at which the reset signal NBR rises may be in the non-selected period of all the unit shift registers SR (e.g., in the blanking period of the display apparatus).

In FIG. 6, the drains of the transistors Q13A and Q13B are connected to the first control terminal CTA and second control terminal CTB, respectively, but both may be connected to the second power terminal S2 (VDD) or second reset terminal RST2. In that case, similar effects as described above can also be obtained.

Third Preferred Embodiment

Figure 8:
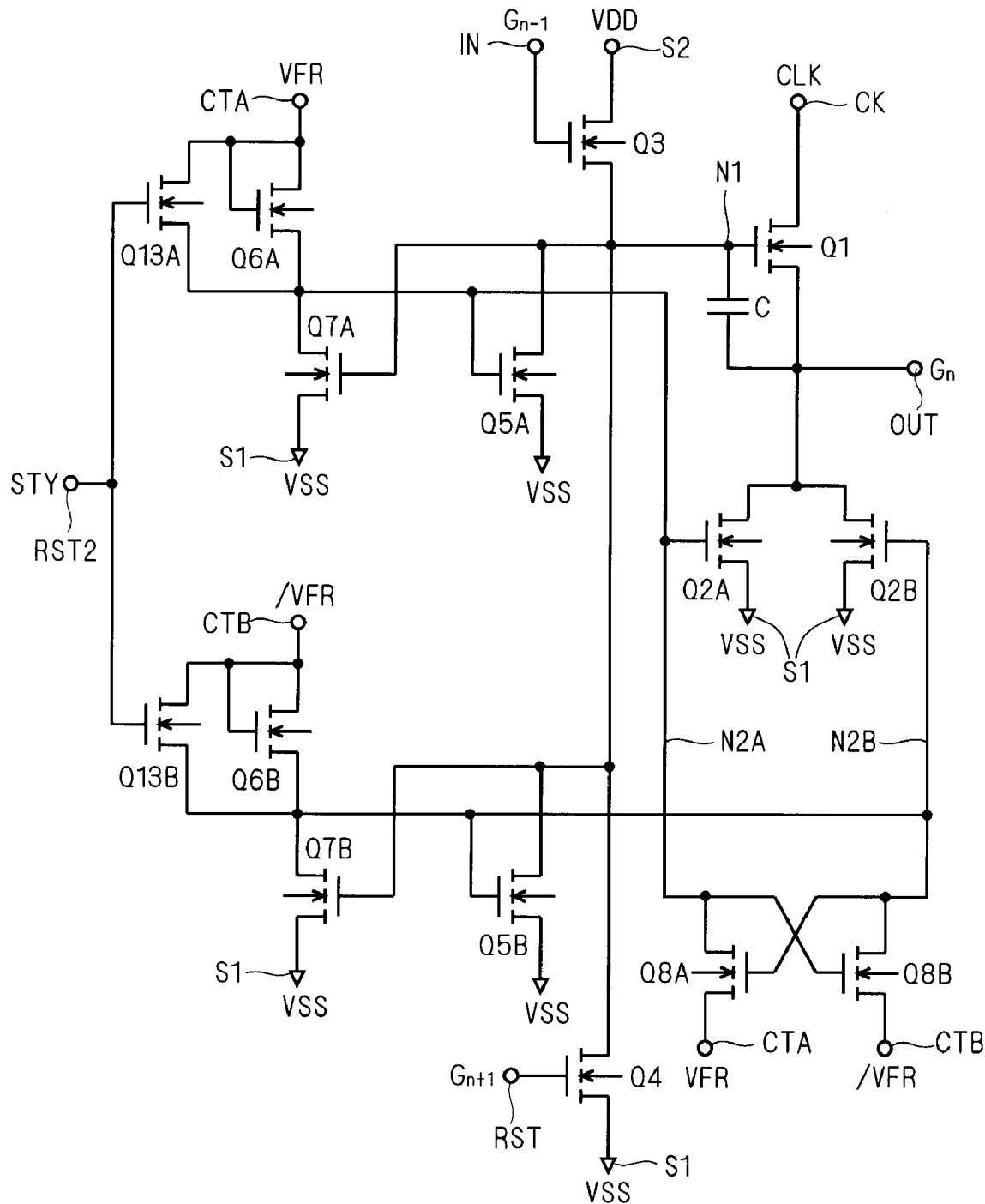
FIG. 8 is a circuit diagram illustrating the configuration of a unit shift register according to a third preferred embodiment of the present invention.

FIG. 8 is a circuit diagram illustrating the configuration of a unit shift register SR according to a third preferred embodiment. The circuit configuration of the unit shift register SR is similar to that of the second preferred embodiment (FIG. 6); in the present embodiment, however, the second reset terminal RST2 receives a start pulse STY as the reset signal NBR. The start pulse STY is a pulse signal corresponding to the head of each frame period of an image signal (i.e., the end of the blanking period), and input to the input terminal IN of the unit shift register $SR_1$ of the forwardmost shift register (of the first stage) as described earlier.

Figure 9:
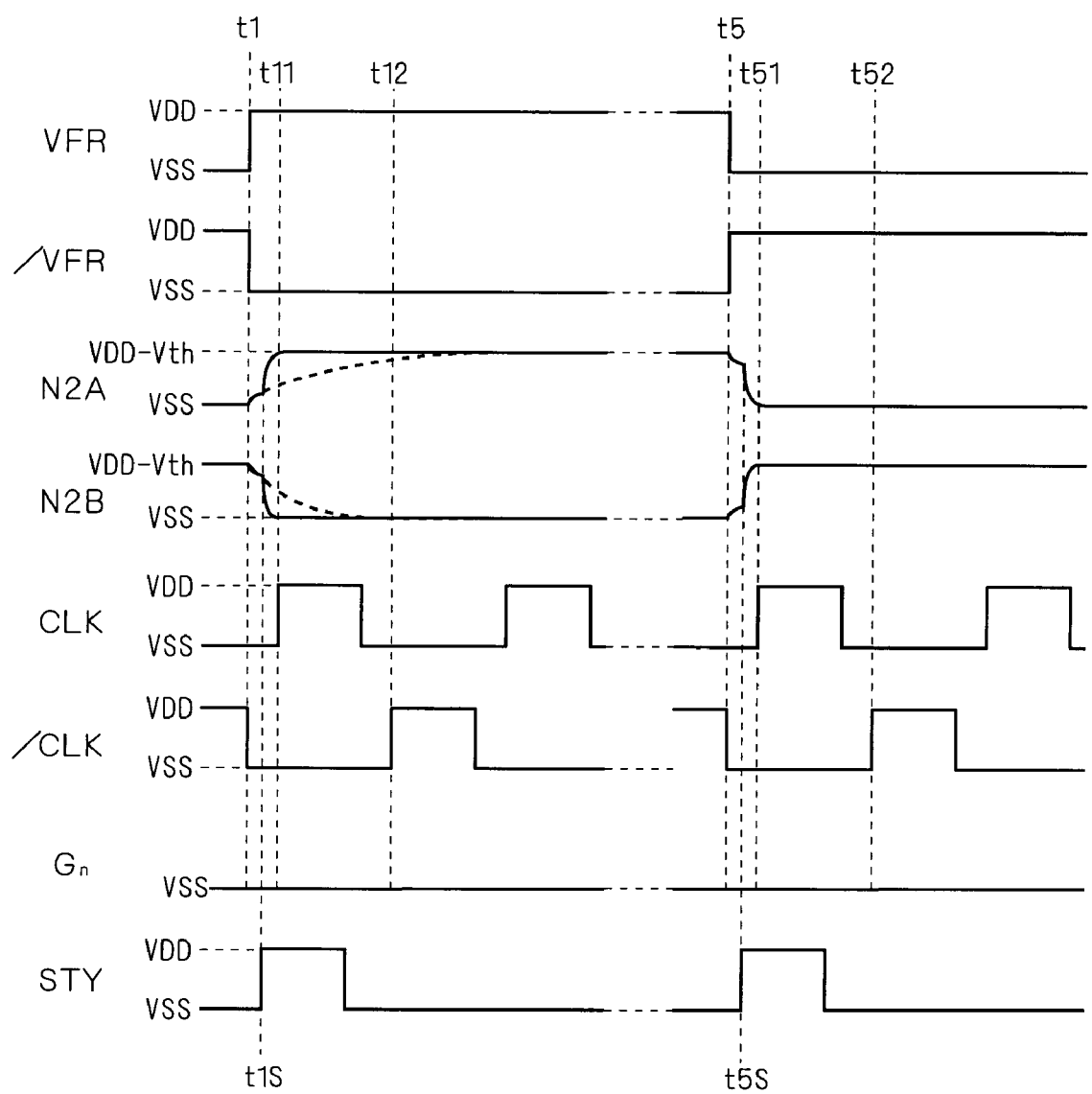
FIG. 9 is a timing chart of the operation of the unit shift register according to the third preferred embodiment.

The start pulse STY corresponds to the head of each frame period, and thus reaches the H level at the end of the blanking period. Therefore, setting the first and second control signals VFR and /VFR to change in level (at time t1, t5) just before the start pulse STY rises to the H level (at time t1S, t5S) as shown in FIG. 9 allows an operation similar to the first preferred embodiment shown in FIG. 7 to be performed, whereby the same effects are obtained.

Since the reset signal NBR is not used in the present embodiment, a circuit for generating the same is not required. The present embodiment is therefore more advantageous in not incurring cost increase than the first preferred embodiment. However, there is a timing restriction that the change in level of the first and second control signals VFR and /VFR needs to be carried out just before the start pulse STY rises to the H level.

It is noted that the unit shift register $SR_1$ of the forwardmost shift register (of the first stage) in the multistage shift register needs to have its node N1 charged to the H level in response to the input of the start pulse STY, and thus, the present embodiment cannot be applied to the unit shift register $SR_1$.

Fourth Preferred Embodiment

Figure 10:
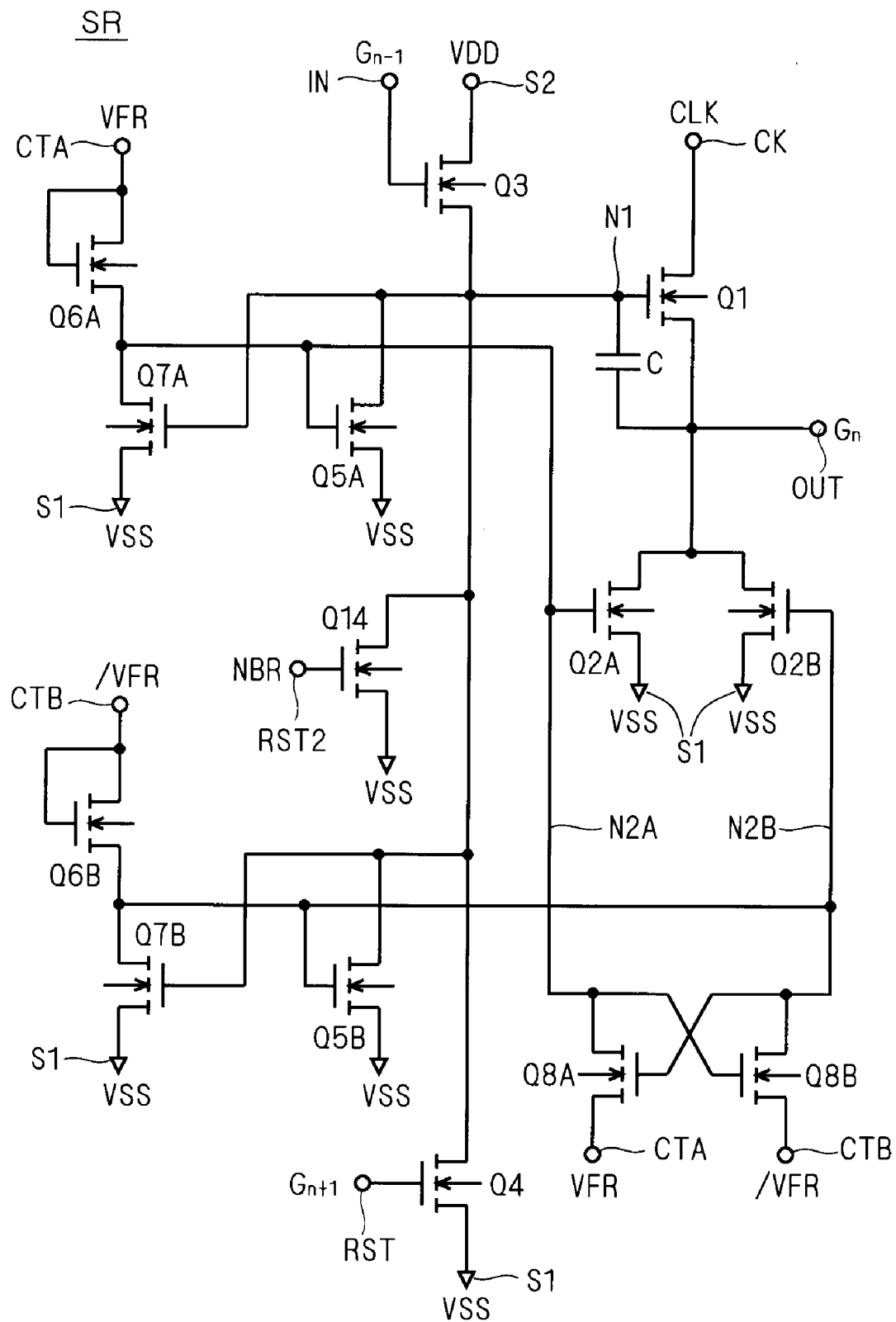
FIG. 10 is a circuit diagram illustrating the configuration of a unit shift register according to a fourth preferred embodiment of the present invention.

FIG. 10 is a circuit diagram illustrating the configuration of a unit shift register SR according to a fourth preferred embodiment. The unit shift register SR includes a transistor Q14 added to the circuit shown in FIG. 1 which is connected between the first power terminal S1 and node N1 and has its gate connected to the second reset terminal RST2.

In the present embodiment, the second reset terminal RST2 receives the reset signal NBR also employed in the above-described second preferred embodiment. The reset signal NBR is a signal that rises to the H level for a certain time period just after the change in level of the first and second control signals VFR and /VFR.

In the unit shift register SR according to the present embodiment, the transistor Q14 turns on by the action of the reset signal NBR only for a certain time period just after the change in level of the first and second control signals VFR and /VFR. Therefore, even if the rate of change in level of the nodes N2A and N2B is not high similarly to the case shown in FIG. 4 and the on-state resistance of the transistors Q5A and Q5B decreases just after the change in level of the first and second control signals VFR and /VFR, the transistor Q14 brings the node N1 into the L level with low impedance instead of the transistors Q5A and Q5B.

In this manner, according to the present embodiment, the transistor Q14 itself serves as discharging means for discharging the node N1 at high speeds on the basis of the reset signal NBR. The present embodiment therefore achieves the effect of preventing the node N1 from rising in level in accordance with the rising of the clock signals CLK and /CLK just after the change in level of the first and second control signals VFR and /VFR, thus preventing the occurrence of an error signal.

In the present embodiment, it is also preferable that the time at which the reset signal NBR rises (time t1A) be earlier than the time at which the clock signals CLK and /CLK rise (time t11), but the order of rising may be reversed. Further, the time at which the reset signal NBR falls (time t1A) may be earlier than the time at which the first and second control signals VFR and /VFR change in level (time t1), and more specifically, may be in the non-selected period of all the unit shift registers SR (e.g., in the blanking period of the display apparatus).

Fifth Preferred Embodiment

Figure 11:
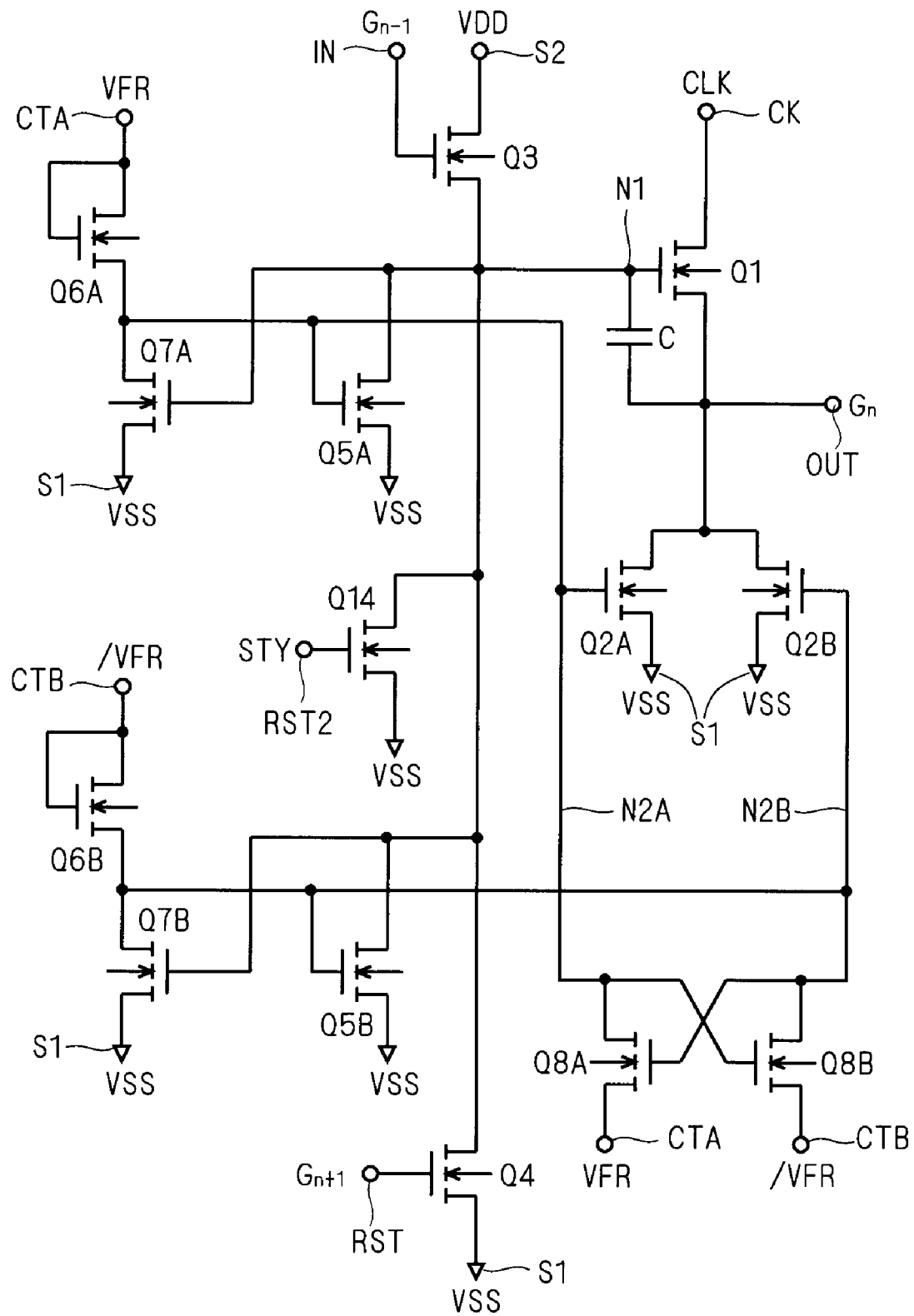
FIG. 11 is a circuit diagram illustrating the configuration of a unit shift register according to a fifth preferred embodiment of the present invention.

FIG. 11 is a circuit diagram illustrating the configuration of a unit shift register SR according to a fifth preferred embodiment. The circuit configuration of the unit shift register SR is similar to that of the fourth preferred embodiment (FIG. 10); in the present embodiment, however, the second reset terminal RST2 receives the start pulse STY, similarly to the third preferred embodiment.

The start pulse STY corresponds to the head of each frame period of an image signal, and thus reaches the H level at the end of the blanking period. Therefore, setting the first and second control signals VFR and /VFR to change in level just before the start pulse STY rises to the H level allows an operation similar to the fourth preferred embodiment to be performed, whereby the same effects are obtained.

The present embodiment is advantageous in not incurring cost increase, similarly to the third preferred embodiment.

However, there is a timing restriction that the change in level of the first and second control signals VFR and /VFR needs to be carried out just before the start pulse STY rises to the H level.

It is noted that the unit shift register $SR_1$ of the forwardmost shift register (of the first stage) in the multistage shift register needs to have its node N1 charged to the H level in response to the input of the start pulse STY, and thus, the present embodiment cannot be applied to the unit shift register $SR_1$.

Sixth Preferred Embodiment

In the display apparatus, the shift register serving as the gate-line driving circuit is formed on the same insulation substrate (glass substrate, etc.) on which an pixel circuit is provided. This reduces the number of external circuits to be connected to that insulation substrate, thus improving the general versatility of the display panel and lightening the load on a user. In the second and fourth preferred embodiments employing the reset signal NBR supplied from outside the shift register, it is preferable that a generation circuit for generating the reset signal NBR be also formed on the same insulation substrate on which the shift register is provided for similar reasons. Further, the generation circuit, when formed of transistors of the same configuration and the same conductivity type as the shift register, can be manufactured in parallel with the shift register, which is also preferable in terms of simplification of manufacturing steps.

Figure 12:
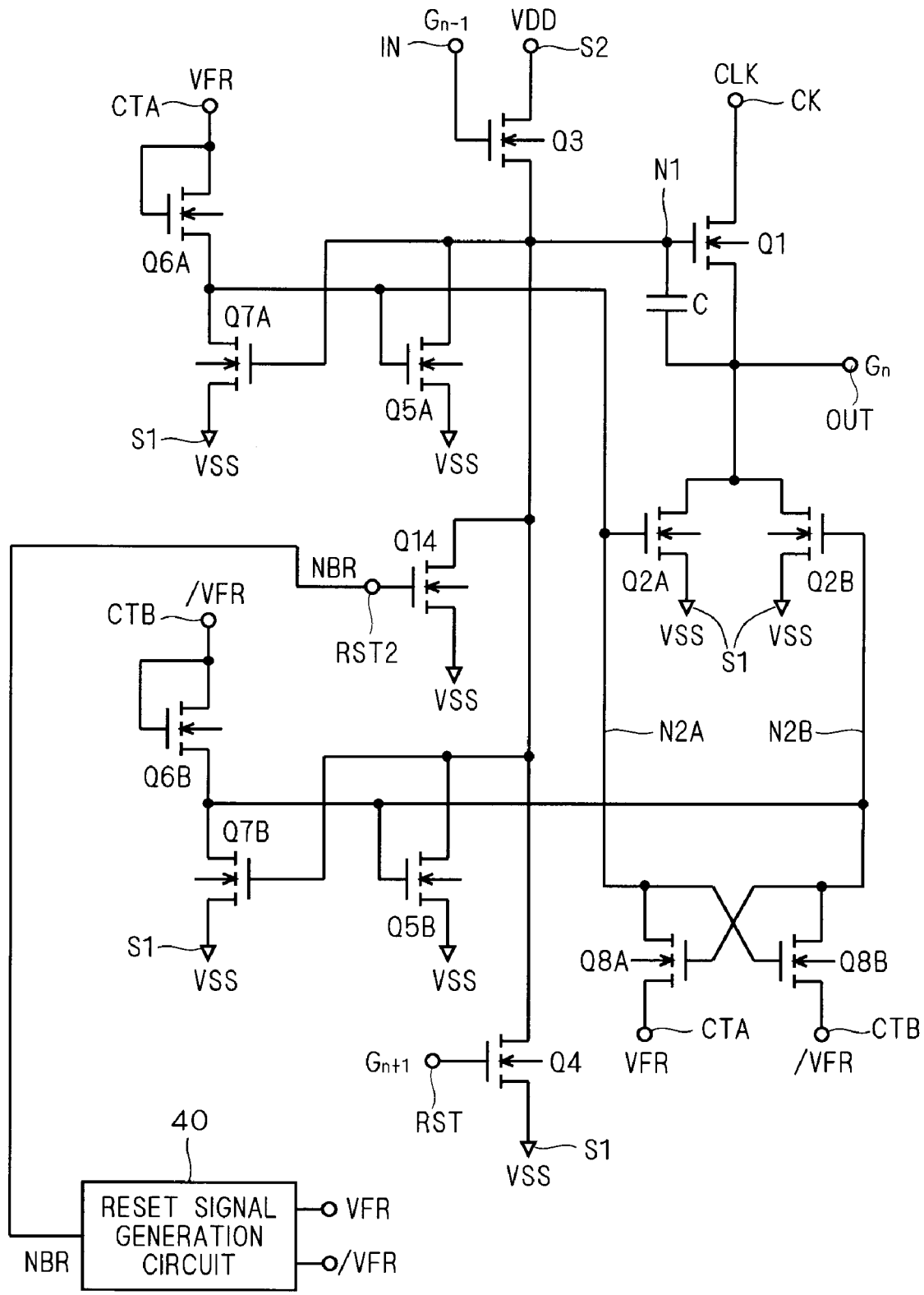
FIG. 12 is a circuit diagram illustrating the configuration of a unit shift register according to a sixth preferred embodiment of the present invention.

FIG. 12 is a circuit diagram illustrating the configuration of a unit shift register SR according to a sixth preferred embodiment. The circuit configuration of the unit shift register SR is similar to that of the fourth preferred embodiment (FIG. 10); in the present embodiment, however, a reset signal generation circuit 40 for generating the reset signal NBR is formed on the same insulation substrate on which the unit shift register SR is provided. The reset signal generation circuit 40 is formed of a-Si TFTs (in this example, N-type TFTs) of the same configuration as the transistors constituting the shift register and pixel transistors of the display panel.

FIG. 13 is a block diagram illustrating a conceptual configuration of the reset signal generation circuit 40 according to the sixth preferred embodiment. As shown in the drawing, the reset signal generation circuit 40 can be constructed from two one-shot pulse generators and a synthesizer for synthesizing outputs therefrom. One of the two one-shot pulse generators generates a pulse NBRA which rises to the H level (i.e., is activated) at the rising of the first control signal VFR, and the other one generates a pulse NBRB which rises to the H level (i.e., is activated) at the rising of the second control signal /VFR. Accordingly, the synthesizer outputs a reset signal NBR which rises to the H level at the rising of both the first and second control signals VFR and /VFR (cf. waveform of reset signal NBR shown in FIG. 7).

FIG. 14 is a circuit diagram illustrating the configuration of the one-shot pulse generator included in the reset signal generation circuit 40. For ease of description, FIG. 14 shows one of the two one-shot pulse generators shown in FIG. 13 that generates the one-shot pulse NBRA.

As shown in FIG. 14, the one-shot pulse generator includes a delay circuit 41 for generating a delay signal delayed from the time at which the first control signal VFR is activated by a predetermined time period (a time period corresponding to the width of a generated one-shot pulse), a buffer circuit for increasing the driving capability of the delay signal, and a pulse generator 43 for generating the one-shot pulse NBRA using the delay signal improved in driving capability by the buffer circuit 42 and first control signal VFR.

The delay circuit 41 is constructed from a plurality of cascade-connected ratio inverters. Each inverter includes a load transistor QL and a driver transistor QD having a sufficiently smaller on-state resistance. The number of cascade-connected inverters is assumed to be m (m is an even number). The input node of the inverter of the first stage (gate of transistor $QD_1$) serves as an input node of the delay circuit 41, and receives the first control signal VFR. The output node of the inverter of the last stage (m-th stage) (node $ND_m$) serves as the output node of the delay circuit 41. Also as understood from FIG. 14, the delay circuit 41 is configured such that inverters of odd-numbered stages are supplied with power from the second control signal /VFR and inverters of even-numbered stages are supplied with power from the first control signal VFR.

The buffer circuit 42 includes transistors Q21 to Q32 and a capacitive element C2, in which the node $ND_m$ which is the output node of the delay circuit 41 serves as the input node and a node N25 shown in FIG. 14 serves as the output node. The pulse generator 43 includes transistors Q33 to Q47 and capacitive elements C3 and C4, and outputs the one-shot pulse NBRA to a node N30 shown in FIG. 14.

Figure 16:
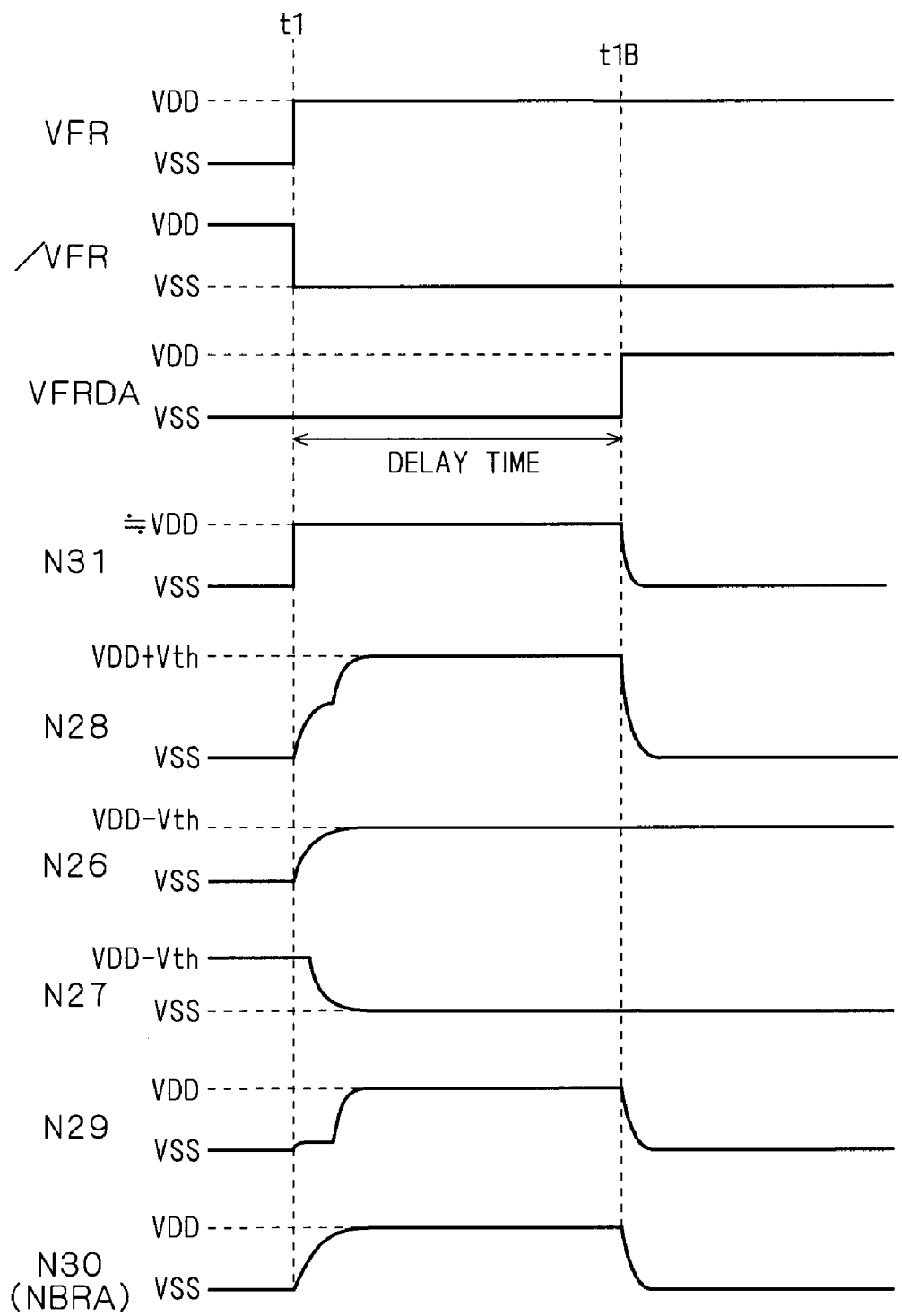

The operation of the one-shot pulse generator shown in FIG. 14 will now be described. FIGS. 15 and 16 are timing charts for explaining the operation of the one-shot pulse generator. More specifically, FIG. 15 shows the operations of the delay circuit 41 and buffer circuit 42, and FIG. 16 shows the operation of the pulse generator 43.

The delay circuit 41 will be described first. As an initial state, it is assumed that the first control signal VFR is at the L level, and the second control signal /VFR is at the H level. At this time, output nodes (nodes $ND_1$, $ND_3$, ..., $ND_{m-1}$) of inverters of odd-numbered stages are charged to the H level (VDD−Vth) by the second control signal /VFR. Driver transistors $QD_2$, $QD_4$, ... $QD_m$ of inverters of even-numbered stages thereby turn on, while load transistors $QL_2$, $QL_4$, ... $QL_m$ of inverters of even-numbered stages are off since the first control signal VFR is at the L level. Accordingly, current flowing through the load transistor and driver transistor does not run through the inverters of even-numbered stages. At the same time, all of the driver transistors of odd-numbered stages are off since the gate voltage is at the L level. Accordingly, a short circuit current does not flow either through the inverters of odd-numbered stages.

It is assumed that, starting from this state, the first control signal VFR changes to the H level and the second control signal /VFR changes to the L level at time t1. Then, the load transistors $QL_1$, $QL_3$, ... $QL_{m-1}$ of inverters of odd-numbered stages turn off, and the driver transistors $QD_2$, $QD_4$, ... $QD_m$ of even-numbered stages turn on. As a result, the load transistor QL and driver transistor QD in each of the inverters of even-numbered stages turn on at the same time. However, since the driver transistor QD has a sufficiently smaller on-state resistance than the load transistor QL, the output nodes ($ND_2$, $ND_4$, ..., $ND_m$) of even-numbered stages do not change from the L level only with the change of the second control signal /VFR to the L level.

On the other hand, the change of the first control signal VFR to the H level causes the output node $ND_1$ of the inverter of the first stage to change from the H level to the L level taking a certain time period. The output node $ND_2$ of the inverter of the second stage accordingly changes from the L level to the H level taking a certain time period. This change in level is then transmitted to the inverter of the m-th stage, so that, as shown in FIG. 15, the output node $ND_m$ of the inverter of the m-th stage rises in level at time t1B delayed from the time at which the first control signal VFR rises (time t1) by a predetermined time period. As a result, a delay signal delayed from the time at which the first control signal VFR rises appears at the output node $ND_m$ of the inverter of the m-th stage.

When the first control signal VFR changes to the L level and the second control signal /VFR changes to the H level, the delay circuit 41 carries out the opposite operation. In the present embodiment, however, the node $ND_m$ is provided with a transistor Q20 discharging the node $ND_m$ at the rising of the second control signal /VFR, causing the delay signal appearing at the node $ND_m$ to fall at the same time as the falling of the first control signal VFR.

The operation of the buffer circuit 42 will now be described. Since the second control signal /VFR is at the H level in the above-described initial state, the transistors Q23, Q24, Q27, Q29 and Q32 shown in FIG. 14 are on, and nodes N21, N24, N23 and N25 are at the L level. Since the transistor Q25 is off at this time, a node N22 is at the H level, and the transistor Q31 is accordingly on.

When the first control signal VFR changes to the H level and the second control signal /VFR changes to the L level at time t1, the transistors Q23, Q24, Q29 and Q32 turn off. However, the nodes N21 and N23 are kept at the L level because transistors Q22 and Q28 are off until the output node $ND_m$ of the delay circuit 41 reaches the H level. Therefore, the transistors Q25, Q26 and Q30 are kept off, the node N22 at the H level, and the nodes N24 and N25 at the L level.

The output node $ND_m$ of the delay circuit 41 rises to the H level (VDD−Vth) at time t1B after the lapse of the aforementioned delay time. Then, the transistor Q28 turns on, bringing the node N23 to the H level (VDD−2×Vth) and the transistors Q26 and Q30 turn on, as shown in FIG. 15. Since the transistor Q27 is on at this time, the node N24 is at the L level of a potential (≈0) determined by the ratio between the on-state resistances of the transistors Q26 and Q27.

In parallel with this at time t1B, the transistor Q22 turns on to bring the node N21 into the H level. The transistor Q25 accordingly turns on to bring the node N22 into the L level. Then, the transistor Q31 turns off to cause the node N25 serving as the output node of the buffer circuit 42 to rise in level. At this time, the transistor Q27 also turns off to raise the node N24 to the H level (VDD).

The rise in level of the node N24 is transmitted to the node N23 by means of a coupling through the capacitive element C2, causing the node N23 to rise in level as shown in FIG. 15. As shown in FIG. 14, however, the buffer circuit 42 is provided with the diode-connected transistor Q21 between the gate (node N23) of the transistor Q30 for charging the node N25 serving as the output node and the drain of the transistor Q30 supplied with power to be used for the charging (first control signal VFR in the example shown in FIG. 14). The transistor Q21 has its anode on the side of the node N23 and its cathode on the side of the drain of the transistor Q30.

Accordingly, when the node N23 rises in level to exceed VDD+Vth, the transistor Q21 turns on to clamp the level of the node N23 at VDD+Vth. When the node N23 rises to VDD+Vth, the transistor Q30 operates in the non-saturated region, causing the node N25 to rise to VDD (if the node N23 is kept at VDD−2×Vth without rising in level, the node N25 can rise only up to VDD−3×Vth).

This state is maintained by the next blanking period, and when the first control signal VFR changes to the L level and the second control signal /VFR to the H level, the aforementioned initial state is brought about again to bring the node N25 into the L level. As a result, a delay signal VFRDA having an amplitude of VDD obtained by improving the driving capability of the output signal from the delay circuit 41 (signal at the node $ND_m$) is output from the node N25. The rising of the delay signal VFRDA is delayed by a predetermined delay time from the rising of the first control signal VFR and the falling thereof occurs concurrently with the falling of the first control signal VFR, similarly to the output signal from the delay circuit 41 (signal at the node $ND_m$).

It is noted again that the buffer circuit 42 shown in FIG. 14 is provided with the transistor Q21 for clamping the gate (node N23) of the transistor Q30 for charging the node N25 serving as the output node so as not to exceed VDD+Vth. When the node N23 rises in level higher than necessary, the Vth shifts in the transistors Q26 and Q30 progress and their on-state resistances increase to degrade the buffer circuit 42 in driving capability. To prevent this, the transistor Q21 is provided.

The operation of the pulse generator 43 will now be described. Since the second control signal /VFR is at the H level in the aforementioned initial state, the transistors Q34, Q35, Q38, Q40, Q44 and Q46 are on, and nodes N26, N28, N30 and N31 are at the L level, and a node N27 at the H level. Since the node N27 is at the H level, the transistor Q38 is on, and a node N29 is at the L level. Since the first delay signal VFRDA is at the L level at this time, the transistors Q43 and Q47 are off.

The one-shot pulse NBRA output from the pulse generator 43 rises to the H level when the output node (node N30) is charged by the transistor Q42. The transistor Q42 is connected between the node N30 and a node supplied with power (potential VDD) to be used for the charging. The transistor Q42 turns on when its gate (node N28) is charged by the transistor Q39. The transistor Q39 is driven by a circuit formed of the capacitive element C4 and transistors Q46 and Q47.

Referring now to FIG. 16, when the first control signal VFR rises to the H level and the second control signal /VFR drops to the L level at time t1, the transistor Q46 turns off, and the node N31 (gate of the transistor Q39) rises to the H level (VDD) by means of the coupling through the capacitive element C4.

The transistor Q39 accordingly turns on, and the node N28 rises to the H level (VDD−Vth), so that the transistors Q37 and Q42 turn on. The node N30 (one-shot pulse NBRA) accordingly rises in level. Since the transistor Q38 is on at this time, the node N29 is at the L level of a potential (≈0) determined by the ratio between the on-state resistances of the transistors Q37 and Q38.

In parallel with this, at time t1, the transistor Q33 turns on to bring the node N26 into the H level. The transistor Q36 accordingly turns on to bring the node N27 into the L level. Then, the transistor Q38 turns off to cause the node N29 to rise to the H level (VDD).

The rise in level of the node N29 is transmitted to the node N28 by means of the coupling through the capacitive element C3, causing the node N28 to rise in level as shown in FIG. 16. As shown in FIG. 14, however, the pulse generator 43 is provided with the diode-connected transistor Q45 between the gate (node N28) of the transistor Q42 and a node (drain of the transistor Q42) supplied with the power supply of VDD. The transistor Q45 has its anode on the side of the node N28 and its cathode on the side of the drain of the transistor Q42.

Accordingly, when the node N28 rises in level to exceed VDD+Vth, the transistor Q45 turns on to clamp the level of the node N28 at VDD+Vth. When the node N28 rises to VDD+Vth, the transistor Q42 operates in the non-saturated region, causing the node N30 serving as the output node of the pulse generator 43 to rise to VDD (if the node N28 is kept at VDD−Vth without rising in level, the node N30 can rise only up to VDD−2×Vth).

The transistor Q45 clamps the node N28 not to exceed VDD+Vth, thereby preventing the Vth shifts in the transistors Q37 and Q42. This suppresses degradation of the pulse generator 43 in driving capability.

Then, at time t1B after the lapse of the aforementioned delay time, the delay signal VFRDA output from the buffer circuit 42 rises to the H level, causing the transistors Q41, Q43 and Q47 to turn on. The node N31 is accordingly discharged to drop to the L level, causing the transistor Q39 to turn off and the nodes N28 and N30 to return to the L level. Since the transistor Q39 is off at this time, a short circuit current does not flow through the transistors Q39 and Q41. Since the drop of the node N28 to the L level causes the transistor Q42 to turn off, a short circuit current does not flow either through the transistors Q42 and Q43.

Through the above-described operations, the one-shot pulse NBRA rising to the H level in accordance with the rising of the first control signal VFR and dropping to the L level in accordance with the rising of the delay signal VFRDA (for the delay time in the delay circuit 41) is output from the output node N30 serving as the output node of the pulse generator 43 (i.e., output node of the one-shot pulse generator).

The state after the delay signal VFRDA has risen is maintained by the next blanking period, and when the second control signal /VFR changes to the H level, the transistor Q46 turns on to discharge the node N31. The aforementioned initial state is thereby brought about again, and the node N30 is kept at the L level until the first control signal VFR rises again. As a result, the one-shot pulse NBRA which rises to the H level in accordance with the rising of the first control signal VFR and is kept at the H level only for a certain time period thereafter is output from the node N30.

FIG. 14 only shows the generator of the one-shot pulse NBRA which rises to the H level at the rising of the first control signal VFR. The one-shot pulse NBRB which rises to the H level at the rising of the second control signal /VFR can be generated by a one-shot pulse generator having a similar circuit configuration shown in FIG. 14 except that the first and second control signals VFR and /VFR are replaced with each other in FIG. 14.

Figure 17:
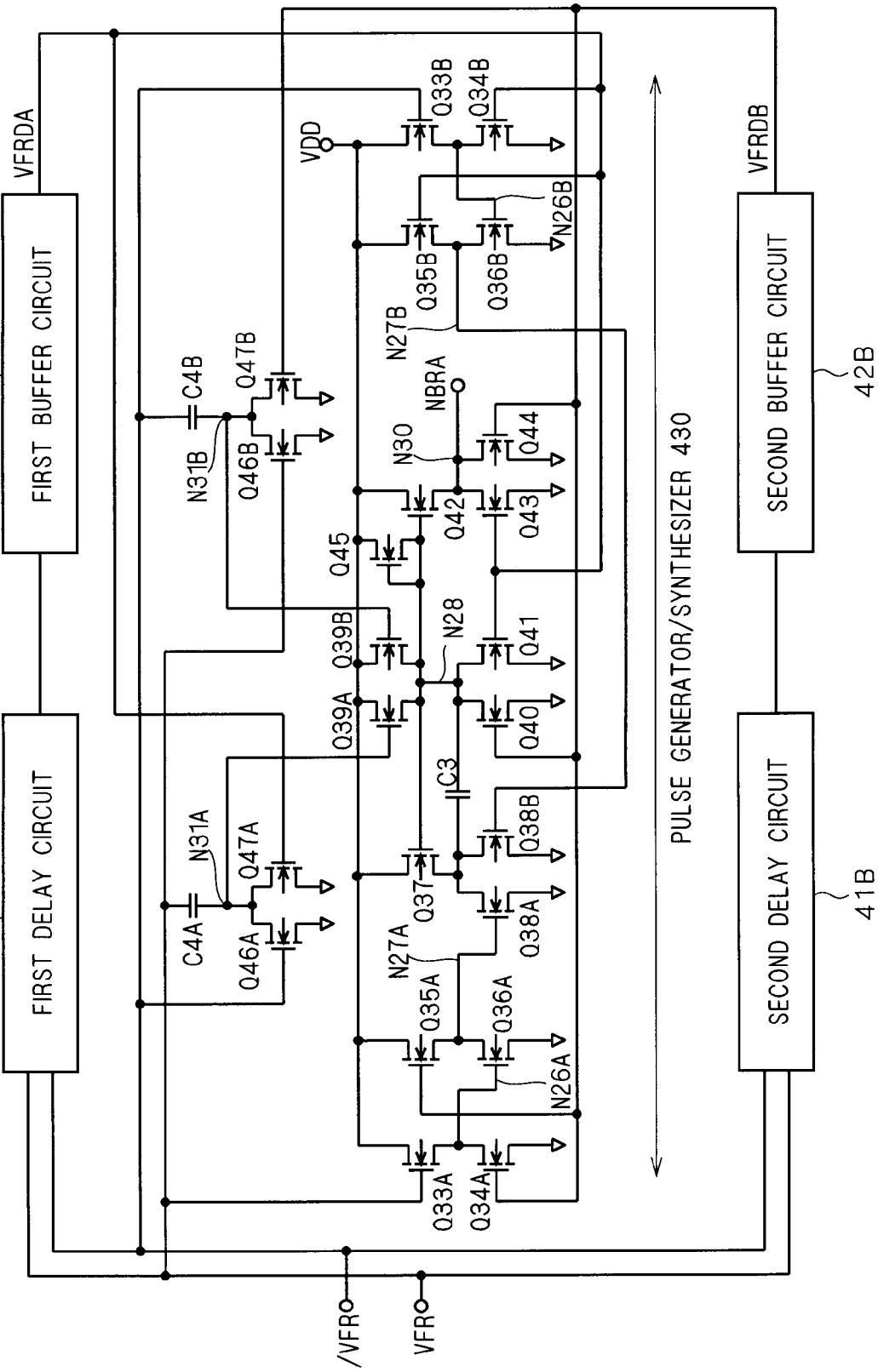
FIG. 17 is a circuit diagram illustrating the configuration of a reset signal generation circuit according to the sixth preferred embodiment.

FIG. 17 is a circuit diagram illustrating the configuration of the reset signal generation circuit 40 formed by combining such two one-shot pulse generators. FIG. 18 is a timing chart of the operation thereof.

A first delay circuit 41A and a first buffer circuit 42A shown in FIG. 17 are similar to the delay circuit 41 and buffer circuit 42 shown in FIG. 14, respectively, and generate the first delay signal VFRDA delayed by a predetermined delay time from the rising of the first control signal VFR as shown in FIG. 18. On the other hand, a second delay circuit 41B and a second buffer circuit 42B shown in FIG. 17 correspond to the delay circuit 41 and buffer circuit 42 shown in FIG. 14, respectively, except that the first and second control signals VFR and /VFR are replaced with each other, and generate a second delay signal VFRDB delayed by a predetermined delay time from the rising of the second control signal /VFR as shown in FIG. 18.

A pulse generator/synthesizer 430 shown in FIG. 17 combines the pulse generator for generating the one-shot pulse NBRA using the first delay signal VFRDA and first control signal VFR and the pulse generator for generating the one-shot pulse NBRB using the second delay signal VFRDB and second control signal /VFR, and outputs both the one-shot pulses NBRA and NBRB from the node N30 serving as its output node, as shown in FIG. 18. In other words, the pulse generator/synthesizer 430 has the function of the synthesizer conceptually shown in FIG. 13, and a signal appearing at the node N3 is the reset signal NBR which rises to the H level for a certain time period when the first and second control signals VFR and /VFR change in level.

As is seen from comparison between the pulse generator 43 shown in FIG. 14 and pulse generator/synthesizer 430 shown in FIG. 17, transistors Q33A to Q36A, Q37, Q38A, Q39A, Q40 to Q45, Q46A, Q47A and capacitive element C3 constitute a similar configuration to the pulse generator 43 shown in FIG. 14. Also, transistors Q33B to Q36B, Q37, Q38B, Q39B, Q40 to Q45, Q46B, Q47B and capacitive element C3 constitute a similar configuration to the pulse generator 43 shown in FIG. 14.

That is, the pulse generator/synthesizer 430 shown in FIG. 17 includes both the pulse generator for generating the one-shot pulse NBRA and the pulse generator for generating the one-shot pulse NBRB, and these two pulse generators share the transistors Q37 and Q40 to Q45 which constitute the output stage.

More specifically, the reset signal NBR output from the pulse generator/synthesizer 430 rises to the H level when the output node (node N30) is charged by the transistor Q42. The transistor Q42 is connected between the node N30 and a node supplied with power (potential VDD) to be used for the charging thereof. The transistor Q42 turns on when its gate (node N28) is charged by the transistor Q39A or Q39B. The transistor Q39A is driven by a circuit formed of a capacitive element C4A and transistors Q46A and Q47A, and the transistor Q39B is driven by a circuit formed of a capacitive element C4B and transistors Q46B and Q47B. The circuit formed of the capacitive element C4A and transistors Q46A and Q47A and the circuit formed of the capacitive element C4B and transistors Q46B and Q47B each correspond to the circuit formed of the capacitive element C4 and transistors Q46 and Q47 shown in FIG. 14.

In other words, the capacitive element C4A raises the gate of the transistor Q39A (node N31A) when the first control signal VFR rises to the H level, to thereby turn on the transistor Q39A. The transistor Q47A discharges the node N31A when the first delay signal VFRDA rises to the H level, and the transistor Q46A discharges the node N31A when the second control signal /VFR rises to the H level. In short, the transistor Q39A turns on at the rising of the first control signal VFR and turns off at the rising of the first delay signal VFRDA.

The capacitive element C4B raises the gate of the transistor Q39B (node N31B) when the second control signal /VFR rises to the H level, to thereby turn on the transistor Q39B. The transistor Q47B discharges the node N31B when the second delay signal VFRDB rises to the H level, and the transistor Q46B discharges the node N31B when the first control signal VFR rises to the H level. In short, the transistor Q39B turns on at the rising of the second control signal /VFR and turns off at the rising of the second delay signal VFRDB.

The transistor Q42 for charging the node N30 accordingly turns on at the rising of the first and second control signals VFR and /VFR, and turns off at the rising of the first and second delay signals VFRDA and VFRDB. As a result, the one-shot pulse NBRA rising to the H level at the rising of the first control signal VFR and one-shot pulse NBRB rising to the H level at the rising of the second control signal /VFR both appear at the node N30. That is, the pulse generator/synthesizer 430 outputs the reset signal NBR obtained by synthesizing the one-shot pulses NBRA and NBRB. The basic operation of the pulse generator/synthesizer 430 is almost similar to that of the pulse generator 43 shown in FIG. 14, and detailed explanation is thus omitted here.

In the pulse generator 43 shown in FIG. 14, the gates of the transistors Q34, Q35, Q40 and Q44 are supplied with the second control signal /VFR, however, the gates of the transistors Q34A, Q35A, Q40 and Q44 in the pulse generator/synthesizer 430 shown in FIG. 17 are supplied with the second delay signal VFRDB. Since the pulse generator 43 shown in FIG. 14 outputs the one-shot pulse NBRA only, there arises no problem even when those transistors are on at the rising of the second control signal /VFR. The pulse generator/synthesizer 430 shown in FIG. 17 outputs the reset signal NBR which rises to the H level at the rising of the first and second control signals VFR and /VFR, which requires those transistors to turn off also at the rising of the second control signal /VFR.

As described above with reference to FIG. 14, the node $ND_m$ serving as the output node of the delay circuit 41 shown in FIG. 14 is provided with the transistor Q20 for discharging the node $ND_m$ at the rising of the second control signal /VFR, causing the delay signal appearing at the node $ND_m$ to fall at the same time as the rising of the second control signal /VFR (cf. delay signals VFRDA, VFRDB in FIG. 18). This is because the transistors Q41 and Q43 need to be turned off at the rising of the second control signal /VFR since the pulse generator/synthesizer 430 shown in FIG. 17 outputs the reset signal NBR which rises to the H level at the rising of both the first and second control signals VFR and /VFR. This is not always necessary in the pulse generator 43 shown in FIG. 14 since it outputs the one-shot pulse NBRA only.

The reset signal generation circuit 40 according to the present embodiment is formed of transistors of the same configuration and the same conductivity type as those of the shift register as shown in FIGS. 14 and 17, and can therefore be formed on the same insulation substrate on which the shift register is provided by similar steps to the shift register, which contributes to cost reduction and simplification of manufacturing steps. Further, this reduces the number of external circuits to be connected to that insulation substrate, thus improving the general versatility of the display panel and lightening the load on a user.

Seventh Preferred Embodiment

Figure 19:
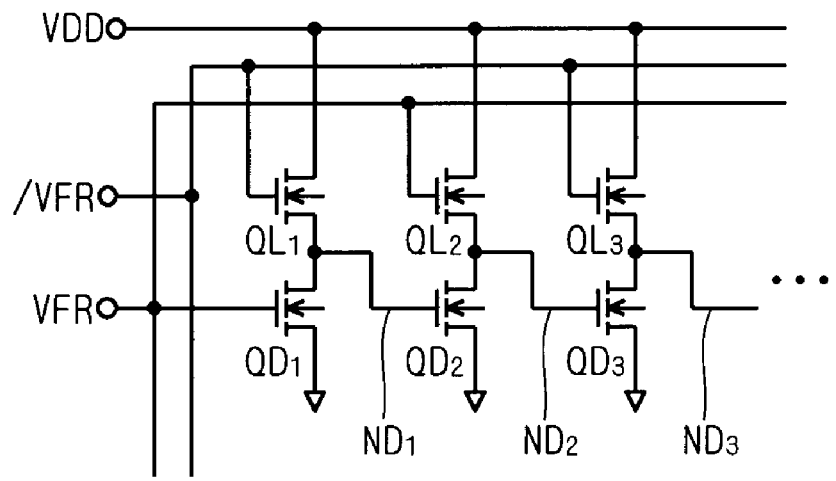
FIG. 19 is a circuit diagram illustrating the configuration of inverters of a delay circuit according to a seventh preferred embodiment of the present invention.

The present embodiment will present a modification of the delay circuit 41 shown in FIG. 14. FIG. 19 is a circuit diagram illustrating the configuration of a delay circuit 41 according to the present embodiment. The inverters constituting the delay circuit 41 shown in FIG. 14 are supplied with power from the first and second control signals VFR and /VFR, but may be supplied with a certain level of high supply voltage VDD, as shown in FIG. 19.

The gate of the load transistor QL receives either of the first and second control signals VFR and /VFR similarly to FIG. 14. For instance, when the input node of the inverter of the first stage receives the first control signal VFR as shown in FIG. 19 (corresponding to the first delay circuit 41A shown in FIG. 17), the gate of the load transistor QL of each odd-numbered stage receives the second control signal /VFR, and the gate of the load transistor QL of each even-numbered stage receives the first control signal VFR.

The delay circuit 41 according to this modification achieves the effect of reducing the loads on the first and second control signals VFR and /VFR as compared to the delay circuit 41 shown in FIG. 14.

Eighth Preferred Embodiment

Figure 20:
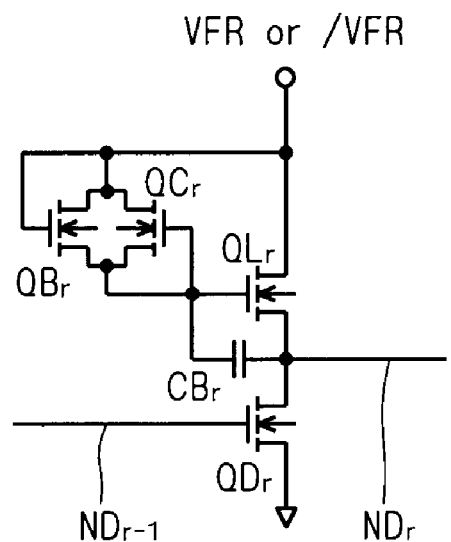
FIG. 20 is a circuit diagram illustrating the configuration of an inverter of a delay circuit according to an eighth preferred embodiment of the present invention.

FIG. 20 is a circuit diagram illustrating the configuration of an inverter of a delay circuit 41 according to an eighth preferred embodiment. The inverter is of the r-th stage. The present embodiment employs an inverter including a bootstrap-type load circuit (bootstrap-type inverter) as the inverter of the delay circuit 41.

As shown in FIG. 20, the load circuit includes a load transistor $QL_r$ as well as transistors $QB_r$ and $QC_r$ connected between the drain and gate of the load transistor $QL_r$ and a capacitive element $CB_r$ connected between the source (node $ND_r$) and gate of the load transistor $QL_r$. The transistors $QB_r$ and $QC_r$ are diode-connected. The transistor $QB_r$ is connected such that the drain of the load transistor $QL_r$ serves as its anode and the gate serves as its cathode. Conversely, the transistor $QC_r$ is connected such that the drain of the load transistor $QL_r$ serves as its cathode and the gate serves as its anode.

According to the inverter of such configuration, the gate of the load transistor $QL_r$ rises in level at the rising of its output node (node $ND_r$) through the capacitive element $CB_r$, causing the load transistor $QL_r$ to operate in the non-saturated region. As a result, the H level of the output signal from the inverter can be raised to VDD without a loss by the threshold voltage Vth of the load transistor $QL_r$. In other words, the output signal increases in amplitude, allowing the operating margin of the inverter to be increased.

When the gate of the load transistor $QL_r$ rises in level, the transistor $QC_r$ clamps the gate of the load transistor $QL_r$ at VDD+Vth, thereby preventing the Vth shift in the load transistor $QL_r$.

Further, when the output node $ND_{r-1}$ of the immediately preceding stage is at the H level, the drain of the load transistor $QL_r$ (first control signal VFR or second control signal /VFR) is at the L level, at which time the gate potential of the load transistor $QL_r$ is Vth. That is, the voltage between the gate and source/drain of the load transistor $QL_r$ at that time is Vth, which is small. This also contributes to the effect of minimizing the Vth shift of the load transistor $QL_r$.

Figure 21:
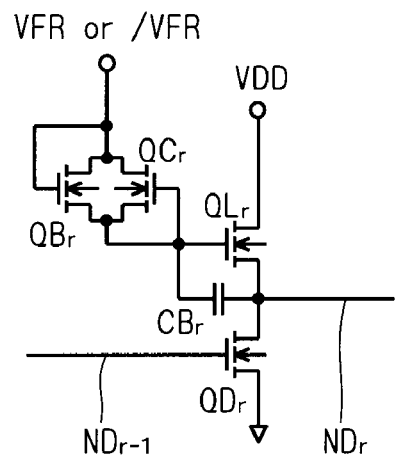
FIG. 21 is a diagram illustrating a modification of the eighth preferred embodiment.

While FIG. 20 shows the example that the drain of the load transistor QL is supplied with power from either the first control signal VFR or second control signal /VFR similarly to FIG. 14, but may be supplied with the constant high supply voltage VDD as shown in FIG. 21. In that case, the anode of the transistor QB and cathode of the transistor QC are also supplied with power from either the first control signal VFR or second control signal /VFR similarly to FIG. 14.

Ninth Preferred Embodiment

As the stage advances in the delay circuit 41 formed of a plurality of cascade-connected inverters as shown in FIG. 14, a time period in which a gate-to-source bias is applied to the load transistor QL becomes longer, so that the Vth shift becomes more likely to occur. The Vth shift in the load transistor QL causes the H level of the output from the inverter to be lowered, which is not preferable in that the operating margin decreases.

Figure 22:
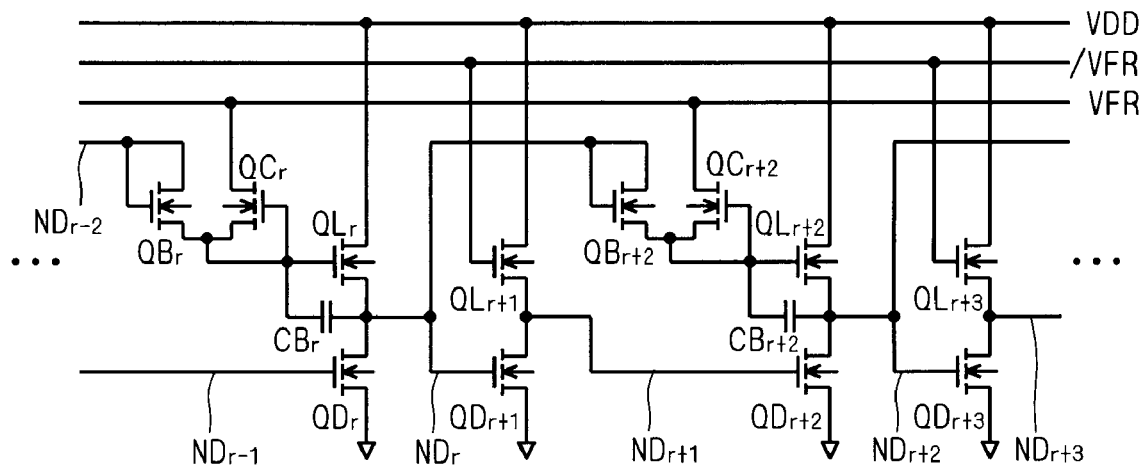
FIG. 22 is a circuit diagram illustrating the configuration of a delay circuit according to a ninth preferred embodiment of the present invention.

FIG. 22 is a circuit diagram illustrating the configuration of inverters of the r- to (r+3)th stages of a delay circuit 41 according to a ninth preferred embodiment. In the present embodiment, as shown in FIG. 22, the output from a bootstrap-type inverter of the r-th stage is supplied to the gate of a load transistor $QL_{r+2}$ of a bootstrap-type inverter of its second succeeding stage through a transistor $QB_{r+2}$.

More specifically, the anode of the transistor QB of the inverter of each stage is supplied with power for charging the gate of the load transistor QL from an output signal of its second preceding stage. Then, the gate of the load transistor QL of each inverter is started to be biased when the output from the inverter of its second preceding stage reaches the H level. This in result reduces a time period in which the gate of the load transistor QL is biased in each inverter to as short as the delay time of one stage of inverter, thus minimizing the Vth shift in the load transistor.

While the drain of the load transistor QL of each inverter is supplied with power from the constant high supply voltage VDD in FIG. 22, the load transistor QL of each even-numbered stage may be supplied with power from the first control signal VFR, and the load transistor QL of each odd-numbered stage may be supplied with power from the second control signal /VFR, similarly to FIG. 14. The load transistor QL to be supplied with the output from the bootstrap-type inverter is not limited to that of its second succeeding stage, but may be of the even-numbered preceding stage.

Tenth Preferred Embodiment

Figure 23:
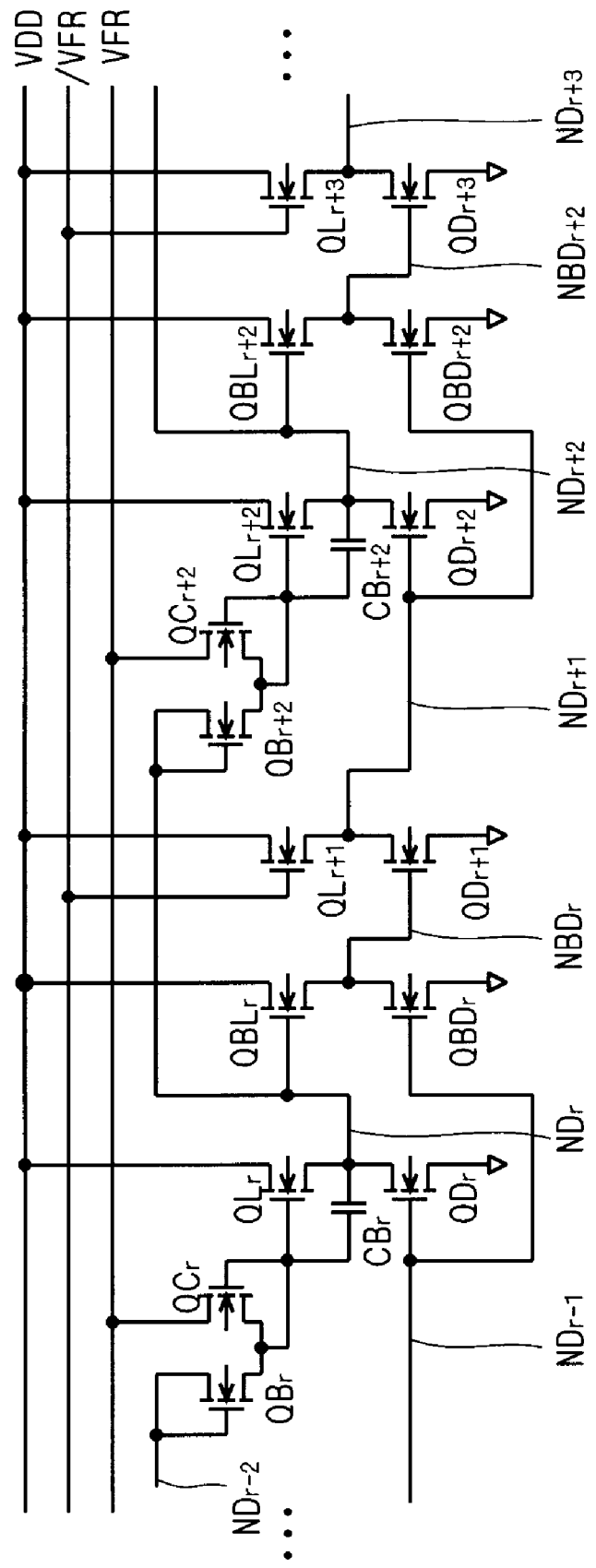
FIG. 23 a circuit diagram illustrating the configuration of a delay circuit according to a tenth preferred embodiment of the present invention.

FIG. 23 a circuit diagram illustrating the configuration of a delay circuit 41 according to a tenth preferred embodiment, which is a modification of the circuit shown in FIG. 22. In the delay circuit 41 shown in FIG. 23, the configuration of FIG. 22 is provided with a totem-pole buffer circuit formed of a load transistor QBL and a driver transistor QBD provided in the output stage of the bootstrap-type inverter.

In the inverter of the r-th stage, driving of the driver transistor $QD_{r+1}$ of the immediately succeeding stage having a great load capacity is carried out through the buffer circuit, thus reducing the load on the bootstrap-type inverter, which allows the gate of the load transistor $QL_{r+2}$ of its second succeeding stage to be charged at high speeds. This increases the operating margin of the bootstrap-type inverter.

Eleventh Preferred Embodiment

Figure 24:
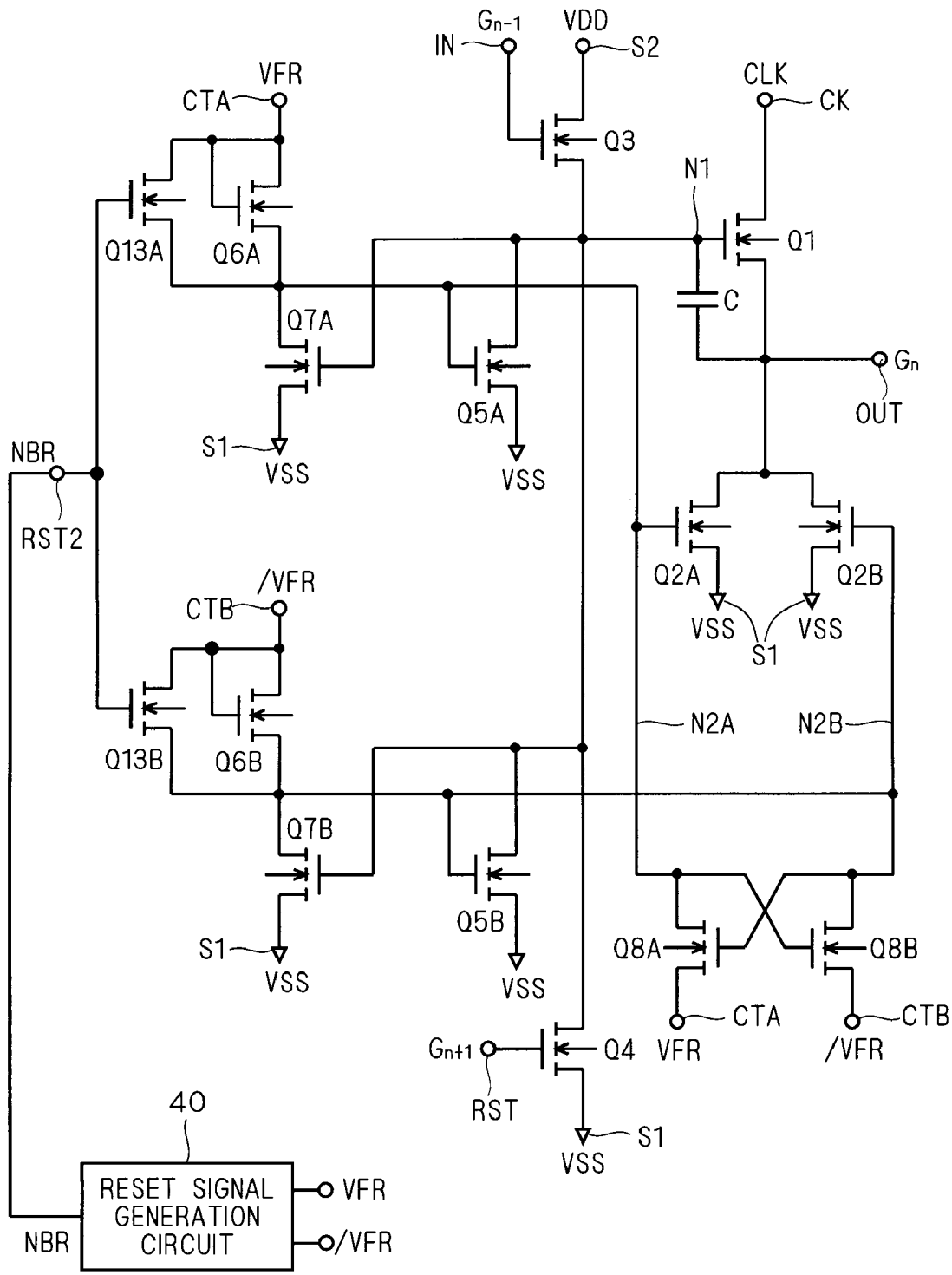
FIG. 24 is a circuit diagram illustrating the configuration of a unit shift register according to an eleventh preferred embodiment of the present invention.

FIG. 24 is a circuit diagram illustrating the configuration of a unit shift register according to an eleventh preferred embodiment. While FIG. 12 shows the example that the unit shift register SR shown in FIG. 10 is provided with the reset signal generation circuit 40 formed on the same insulation substrate as the unit shift register SR, it is needless to say that the reset signal generation circuit 40 may be applied to the unit shift register SR shown in FIG. 6, as shown in FIG. 24.

Twelfth Preferred Embodiment

According to the above-described preferred embodiments, the transistors Q2A and Q2B of the unit shift register SR are alternately driven using two inverters (first and second inverters), however, a similar operation may be carried out by a single inverter. The present invention is also applicable to a unit shift register SR configured as such.

Figure 25:
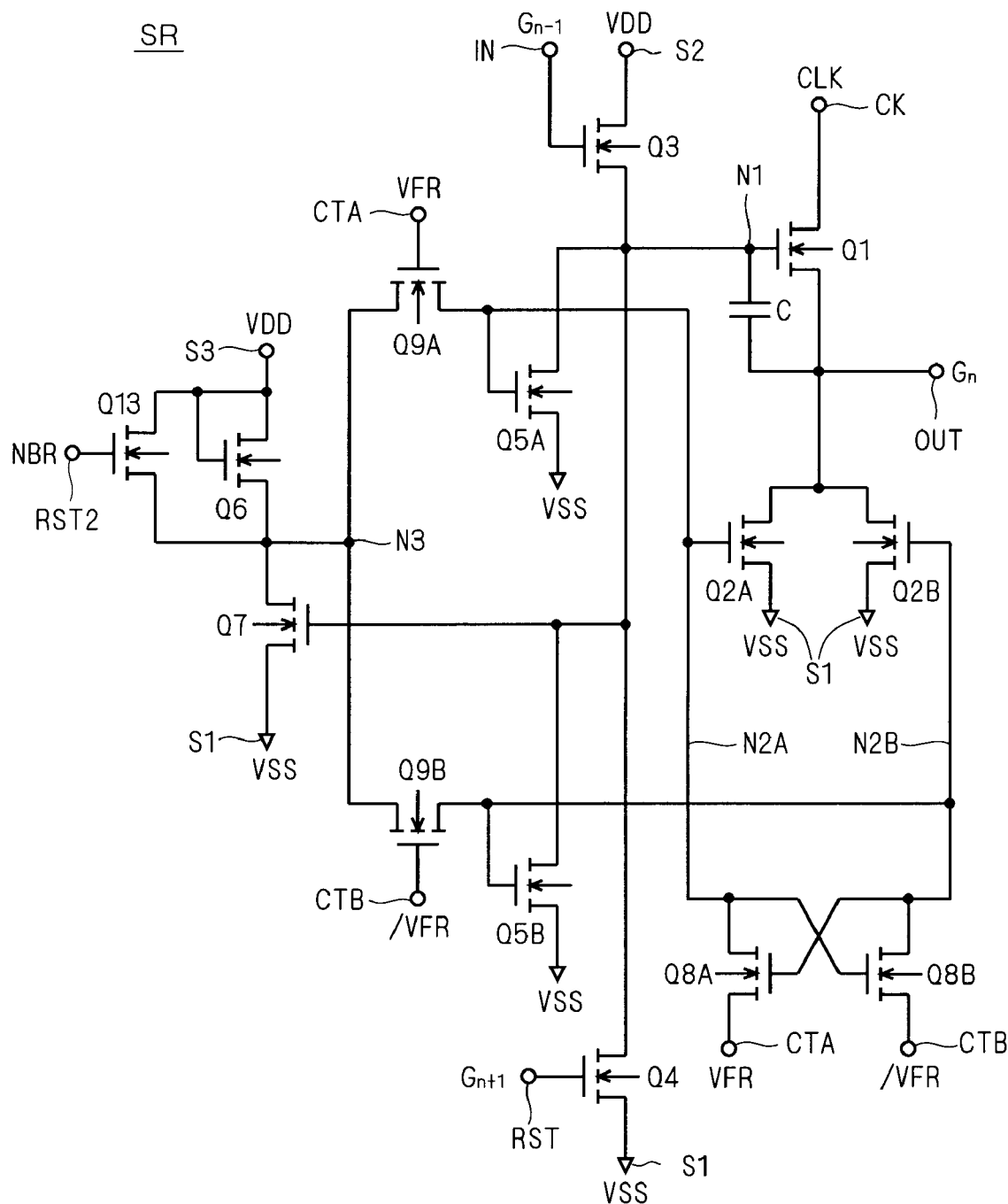
FIG. 25 is a circuit diagram illustrating the configuration of a unit shift register according to a twelfth preferred embodiment of the present invention.

FIG. 25 is a circuit diagram illustrating the configuration of a unit shift register SR according to a twelfth preferred embodiment. In the unit shift register SR, a driving circuit for driving the transistors Q2A and Q2B includes an inverter formed of transistors Q6 and Q7, a transistor Q9A connected between the output node of the inverter (defined as a "node N3") and node N2A, and a transistor Q9B connected between the nodes N3 and N2B. The transistor Q9A has its gate connected to the first control terminal CTA supplied with the first control signal VFR, and the transistor Q9B has its gate connected to the second control terminal CTB supplied with the second control signal /VFR. In the inverter, the transistor Q6 is diode-connected and connected between the node N3 and third power terminal S3, and the transistor Q7 is connected between the node N1 and first power terminal S1 and has its gate connected to the node N1.

According to the present embodiment, in a time period in which the first control signal VFR is at the H level and the second control signal /VFR is at the L level, the transistor Q9A turns on, and the transistor Q9B turns off, causing the output node of the inverter, i.e., node N3 to be electrically connected to the node N2A. In other words, the transistor Q2A is driven and the transistor Q2B is deactivated in that period. Conversely, in a time period in which the first control signal VFR is at the L level and the second control signal /VFR is at the H level, the transistor Q9A turns off, and the transistor Q9B turns on, causing the node N3 to be electrically connected to the node N2B. In other words, the transistor Q2B is driven and the transistor Q2A is deactivated in that period. In this manner, the transistors Q9A and Q9B serve as a switching circuit for connecting the output node (node N3) of the inverter formed of the transistors Q6 and Q7 alternately to the nodes N2A and N2B on the basis of the first and second control signals VFR and /VFR.

The inverter according to the present embodiment is provided with a transistor Q13 connected between the third power terminal S3 and node N3. This transistor Q13 is set to have a sufficiently greater driving capability (i.e., have a sufficiently smaller on-state resistance) than the transistor Q6. The transistor Q13 has its gate connected to the second reset terminal RST2 supplied with the reset signal NBR. This reset signal NBR may be the same one that has been employed in the above-described preferred embodiments.

With such configuration, the transistor Q13 turns on when the first and second control signals VFR and /VFR change in level, causing the node N2A or N2B to rise to the H level in a short time period (which one of the nodes N2A and N2B rises to the H level depends on which one of the transistors Q9A and Q9B turns on by the change in level of the first and second control signals VFR and /VFR). Then, the transistor Q5A or Q5B discharges the node N1 immediately to the L level with low impedance. This in result prevents both the transistors Q5A and Q5B from increasing in resistance at the change in level of the first and second control signals VFR and /VFR to unstabilize the operation of the unit shift register SR, so that similar effects to those of the second preferred embodiment can be obtained.

In the present embodiment, the reset signal NBR may be supplied from the reset signal generation circuit 40 formed on the same insulation substrate as the shift register SR, similarly to the sixth preferred embodiment. Further, the first reset terminal RST may be supplied with the start pulse STY, similarly to the third preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A shift register comprising:
   a clock terminal and an output terminal;
   a first transistor configured to supply a clock signal received at said clock terminal to said output terminal;
   second and third transistors each configured to discharge said output terminal; and a driving circuit configured to switch between said second and third transistors for driving, on the basis of a change in level of a predetermined control signal, wherein nodes to which control electrodes of said first, second and third transistors are connected are defined as first, second and third nodes, respectively, said shift register further comprising:

a fourth transistor having a control electrode connected to said second node and configured to discharge said first node; and a fifth transistor having a control electrode connected to said third node and configured to discharge said first node, wherein input of said clock signal to said clock terminal is prohibited at least for one pulse just after the change in level of said predetermined control signal.

2. A shift register comprising a plurality of shift registers connected in cascade, each being defined in claim 1.

3. An image display apparatus comprising a multistage shift register formed of a plurality of shift registers connected in cascade as a gate-line driving circuit, wherein each stage of said multistage shift register includes:

a clock terminal and an output terminal;

a first transistor configured to supply a clock signal received at said clock terminal to said output terminal;

second and third transistors each configured to discharge said output terminal; and a driving circuit configured to switch between said second and third transistors for driving, on the basis of a change in level of a predetermined control signal, wherein nodes to which control electrodes of said first, second and third transistors are connected are defined as first, second and third nodes, respectively, said shift register further comprising:

a fourth transistor having a control electrode connected to said second node and configured to discharge said first node; and a fifth transistor having a control electrode connected to said third node and configured to discharge said first node, wherein input of said clock signal to said clock terminal is prohibited at least for one pulse just after the change in level of said predetermined control signal.

4. A shift register comprising:

a clock terminal and an output terminal;

a first transistor configured to supply a clock signal received at said clock terminal to said output terminal;

second and third transistors each configured to discharge said output terminal; and a driving circuit configured to switch between said second and third transistors for driving, on the basis of a change in level of a predetermined control signal, wherein nodes to which control electrodes of said first, second and third transistors are connected are defined as first, second and third nodes, respectively, said shift register further comprising:

a fourth transistor having a control electrode connected to said second node and configured to discharge said first node;

a fifth transistor having a control electrode connected to said third node and configured to discharge said first node; and a discharging element configured to discharge said first node in a predetermined time period just after the change in level of said control signal on the basis of a reset signal activated in said predetermined time period.

5. The shift register according to claim 4, wherein said discharging element is a charging circuit configured to charge one of said second and third nodes so as to cause one of said fourth and fifth transistors to discharge said first node on the basis of said reset signal.

6. The shift register according to claim 5, wherein said charging circuit includes:

a sixth transistor configured to charge said second node on the basis of said reset signal; and a seventh transistor configured to charge said third node on the basis of said reset signal.

7. The shift register according to claim 5, wherein said driving circuit includes a switching circuit configured to electrically connect an output node of said driving circuit alternately to one of said second and third nodes on the basis of said control signal, and said charging circuit is a sixth transistor configured to charge said output node of said driving circuit on the basis of said reset signal.

8. The shift register according to claim 4, wherein said discharging element is a discharging circuit configured to discharge said first node on the basis of said reset signal.

9. The shift register according to claim 8, wherein said discharging circuit is a sixth transistor configured to charge said first node on the basis of said reset signal.

10. A multistage shift register comprising a plurality of shift registers connected in cascade, wherein each stage of said multistage shift register is the shift register defined in claim 4.

11. The multistage shift register according to claim 10, wherein said reset signal is a start pulse for activating the first stage of said multistage shift register.

12. An image display apparatus comprising a multistage shift register formed of a plurality of shift registers connected in cascade as a gate-line driving circuit, wherein each stage of said multistage shift register includes:

a clock terminal and an output terminal;

a first transistor configured to supply a clock signal received at said clock terminal to said output terminal;

second and third transistors each configured to discharge said output terminal; and a driving circuit configured to switch between said second and third transistors for driving, on the basis of a change in level of a predetermined control signal, wherein nodes to which control electrodes of said first, second and third transistors are connected are defined as first, second and third nodes, respectively, said shift register further comprising:

a fourth transistor having a control electrode connected to said second node and configured to discharge said first node;

a fifth transistor having a control electrode connected to said third node and configured to discharge said first node; and a discharging element configured to discharge said first node in a predetermined time period just after the change in level of said control signal on the basis of a reset signal activated in said predetermined time period.

13. A signal generation circuit for generating a reset signal activated for a predetermined time period just after a change in level of a control signal, on the basis of said control signal composed of first and second control signals complementary to each other, and supplying said reset signal to a shift register, wherein
said shift register includes:
a clock terminal and an output terminal;
a first transistor configured to supply a clock signal received at said clock terminal to said output terminal;
second and third transistors each configured to discharge said output terminal; and
a driving circuit configured to switch between said second and third transistors for driving, on the basis of a change in level of said control signal, wherein
nodes to which control electrodes of said first, second and third transistors are connected are defined as first, second and third nodes, respectively,
said shift register further includes:
a fourth transistor having a control electrode connected to said second node and configured to discharge said first node;
a fifth transistor having a control electrode connected to said third node and configured to discharge said first node; and
a discharging element configured to discharge said first node in said predetermined time period on the basis of said reset signal,
said signal generation circuit comprising:
a first delay circuit configured to generate a first delay signal delayed from a time at which said first control signal is activated;
a second delay circuit configured to generate a second delay signal delayed from a time at which said second control signal is activated; and
a pulse generation circuit configured to generate a pulse signal activated in accordance with activation of said first and second control signals and deactivated in accordance with activation of said first and second delay signals, wherein
said pulse signal is output as said reset signal.

14. The signal generation circuit according to claim 13, further comprising:
a first buffer circuit provided between said first delay circuit and said pulse generation circuit and configured to increase the driving capability of said first delay signal to be input to said pulse generation circuit; and
a second buffer circuit provided between said second delay circuit and said pulse generation circuit and configured to increase the driving capability of said second delay signal to be input to said pulse generation circuit.

15. The signal generation circuit according to claim 13, wherein
said first and second delay circuits each include a plurality of inverters connected in cascade.

16. The signal generation circuit according to claim 15, wherein
each of said plurality of inverters includes an eighth transistor having one main electrode connected to an output node of each of said plurality of inverters and the other main electrode supplied with power from a predetermined power supply, said eighth transistor being diode-connected such that the one main electrode serves as a cathode and the other main electrode serves as an anode, and
one of each odd-numbered stage and each even-numbered stage of said plurality of inverters is supplied with said first control signal as said predetermined power supply, and the other one is supplied with said second control signal as said predetermined power supply.

17. The signal generation circuit according to claim 15, wherein
each of said plurality of inverters includes an eighth transistor having one main electrode connected to an output node of each of said plurality of inverters and the other main electrode supplied with power from a power supply having a constant potential, and
one of each odd-numbered stage and each even-numbered stage of said plurality of inverters is supplied with said first control signal at a control terminal of said eighth transistor, and the other one is supplied with said second control signal at said control terminal of said eighth transistor.

18. The signal generation circuit according to claim 15, wherein
each of said plurality of inverters includes:
an eighth transistor having one main electrode connected to an output node of each of said plurality of inverters and the other main electrode supplied with power from one of a predetermined first power supply and a second power supply having a constant potential;
a ninth transistor having one main electrode connected to a control electrode of said eighth transistor and the other main electrode supplied with power from said predetermined first power supply, said ninth transistor being diode-connected such that the one main electrode serves as an anode and the other main electrode serves as a cathode;
a tenth transistor having one main electrode connected to said control electrode of said eighth transistor and the other main electrode supplied with power from said predetermined first power supply, said tenth transistor being diode-connected such that the one main electrode serves as a cathode and the other main electrode serves as an anode; and
a first capacitive element connected between said output node of each of said plurality of inverters and said control electrode of said eighth transistor, and
one of each odd-numbered stage and each even-numbered stage of said plurality of inverters is supplied with said first control signal serving as said predetermined first power supply, and the other one is supplied with said second control signal serving as said predetermined first power supply.

19. The signal generation circuit according to claim 15, wherein
each of said plurality of inverters includes:
an eighth transistor having one main electrode connected to an output node of each of said plurality of inverters and the other main electrode supplied with power from one of a predetermined first power supply and a second power supply having a constant potential;
a ninth transistor having one main electrode connected to a control electrode of said eighth transistor and the other main electrode supplied with power from said predetermined first power supply, said ninth transistor being diode-connected such that the one main electrode serves as an anode and the other main electrode serves as a cathode;
a tenth transistor having one main electrode connected to said control electrode of said eighth transistor and the other main electrode supplied with power from an output signal of an even number preceding stage, said tenth transistor being diode-connected such that the one main electrode serves as a cathode and the other main electrode serves as an anode; and a first capacitive element connected between said output node of each of said plurality of inverters and said control electrode of said eighth transistor, and one of each odd-numbered stage and each even-numbered stage of said plurality of inverters is supplied with said first control signal serving as said predetermined first power supply, and the other one is supplied with said second control signal serving as said predetermined first power supply.

20. The signal generation circuit according to claim 15, wherein each of said plurality of inverters includes a totem-pole buffer circuit in its output stage.

21. The signal generation circuit according to claim 14, wherein each of said first and second buffer circuits includes:

an eleventh transistor configured to charge an output node of each of said first and second buffer circuits, and having one main electrode connected to said output node and the other main electrode supplied with power to be used for charging said output node; and a twelfth transistor connected between a control electrode and said other main electrode of said eleventh transistor, and diode-connected such that said control electrode of said eleventh transistor serves as an anode and said other main electrode of said eleventh transistor serves as a cathode.

22. The signal generation circuit according to claim 13, wherein said pulse generation circuit includes:

a thirteenth transistor configured to charge an output node of said pulse generation circuit, and having one main electrode connected to said output node and the other main electrode supplied with power to be used for charging said output node; and a fourteenth transistor connected between a control electrode and said other main electrode of said thirteenth transistor, and diode-connected such that said control electrode of said thirteenth transistor serves as an anode and said other main electrode of said thirteenth transistor serves as a cathode.

23. The signal generation circuit according to claim 22, further comprising:

fifteenth and sixteenth transistors each configured to charge said control electrode of said thirteenth transistor;

a second capacitive element configured to raise a control electrode of said fifteenth transistor in voltage level in accordance with activation of said first control signal;

a seventeenth transistor configured to discharge said control electrode of said fifteenth transistor in accordance with activation of said first delay signal;

a third capacitive element configured to raise a control electrode of said sixteenth transistor in voltage level in accordance with activation of said second control signal; and an eighteenth transistor configured to discharge said control electrode of said sixteenth transistor in accordance with activation of said second delay signal.

24. The signal generation circuit according to claim 23, further comprising:

a nineteenth transistor configured to discharge said control electrode of said fifteenth transistor in accordance with activation of said second control signal; and a twelfth transistor configured to discharge said control electrode of said sixteenth transistor in accordance with activation of said first control signal.

* * * * *